(12) United States Patent
Akahoshi et al.

(10) Patent No.: US 10,362,677 B2
(45) Date of Patent: Jul. 23, 2019

(54) CAPACITOR BUILT-IN MULTILAYER WIRING SUBSTRATE AND MANUFACTURING METHOD THEREOF

(71) Applicant: FUJITSU LIMITED, Kawasaki-shi, Kanagawa (JP)

(72) Inventors: Tomoyuki Akahoshi, Atsugi (JP); Daisuke Mizutani, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/043,603

(22) Filed: Jul. 24, 2018

(65) Prior Publication Data

US 2018/0332707 A1 Nov. 15, 2018

Related U.S. Application Data

(63) Continuation of application No. PCT/JP2016/053155, filed on Feb. 3, 2016.

(51) Int. Cl.
*H05K 1/00* (2006.01)
*H05K 1/16* (2006.01)
(Continued)

(52) U.S. Cl.
CPC ............... *H05K 1/162* (2013.01); *H01G 4/12* (2013.01); *H01G 4/1227* (2013.01); *H01G 4/33* (2013.01);
(Continued)

(58) Field of Classification Search
CPC .. H05K 1/00; H05K 1/02; H05K 1/16; H05K 1/18; H01L 23/02; H01L 23/48;
(Continued)

(56) References Cited

U.S. PATENT DOCUMENTS 6,172,305 B1 * 1/2001 Tanahashi ............... H01L 23/50
174/255
6,875,921 B1 * 4/2005 Conn ...................... H01L 23/50
174/534
(Continued)

FOREIGN PATENT DOCUMENTS

JP 58-158996 A 9/1983
JP 1-166599 A 6/1989
(Continued)

OTHER PUBLICATIONS

International Search Report w/English translation and Written Opinion in Japanese dated Apr. 19, 2016, issued in counterpart International Application No. PCT/JP2016/053155 (9 pages).

*Primary Examiner* — Xiaoliang Chen
(74) *Attorney, Agent, or Firm* — Westerman, Hattori, Daniels & Adrian, LLP

(57) ABSTRACT

A substrate includes: a signal line via, a ground line via, and a power supply line via; a first group of first conductor layers formed at a first wiring layer level and coupled to the signal line via, the ground line via, and the power supply line via; a second conductor layer formed at a second wiring layer level and coupled to the power supply line via; a second group of third conductor layers formed at a third wiring layer level and coupled to the signal line via, the ground line via, and the power supply line via; a first insulating layer; and a second insulating layer, wherein the second insulating layer has an opening with a third insulating layer, a relative dielectric constant of the second insulating layer is higher than the first insulating layer and the third insulating layer, and the opening reaches a conductor pattern.

10 Claims, 27 Drawing Sheets

(51) Int. Cl.
*H01G 4/12* (2006.01)
*H05K 3/46* (2006.01)
*H01G 4/33* (2006.01)
*H01L 21/48* (2006.01)
*H01L 23/498* (2006.01)
*H01L 49/02* (2006.01)
*H05K 1/11* (2006.01)
*H05K 3/00* (2006.01)
*H05K 3/42* (2006.01)

(52) U.S. Cl.
CPC ........ *H01L 21/486* (2013.01); *H01L 21/4857* (2013.01); *H01L 23/49822* (2013.01); *H01L 23/49838* (2013.01); *H01L 28/60* (2013.01); *H05K 1/115* (2013.01); *H05K 1/16* (2013.01); *H05K 3/0026* (2013.01); *H05K 3/422* (2013.01); *H05K 3/423* (2013.01); *H05K 3/46* (2013.01); *H05K 2201/093* (2013.01); *H05K 2203/072* (2013.01); *H05K 2203/0723* (2013.01); *H05K 2203/107* (2013.01)

(58) Field of Classification Search
CPC ......... H01L 23/50; H01L 23/538; H01G 4/30; H01G 4/232; H01G 4/302
USPC ....... 174/260, 255, 258, 261, 534, 557, 558; 257/686, 698, 773, 778; 361/766, 767, 361/782, 794
See application file for complete search history.

(56) References Cited

U.S. PATENT DOCUMENTS

| | | | |
|---|---|---|---|
| 7,233,061 B1* | 6/2007 | Conn | H01L 23/50 257/686 |
| 7,566,960 B1* | 7/2009 | Conn | H01L 23/055 257/678 |
| 2004/0012938 A1* | 1/2004 | Sylvester | H01L 21/4857 361/794 |
| 2004/0256731 A1* | 12/2004 | Mao | C08L 65/00 257/773 |
| 2004/0257749 A1* | 12/2004 | Otsuka | H01G 2/065 361/306.3 |
| 2007/0297157 A1* | 12/2007 | Tanaka | H01L 23/49822 361/766 |
| 2009/0290316 A1* | 11/2009 | Kariya | H01L 23/50 361/767 |
| 2010/0181285 A1* | 7/2010 | Tanaka | H01G 4/232 216/17 |

FOREIGN PATENT DOCUMENTS

| | | |
|---|---|---|
| JP | 11-204946 A | 7/1999 |
| JP | 2001-267751 A | 9/2001 |
| JP | 2006-261658 A | 9/2006 |
| JP | 2007-234715 A | 9/2007 |
| JP | 2015-53350 A | 3/2015 |
| WO | 2006/134914 A1 | 12/2006 |

* cited by examiner

CAPACITOR BUILT-IN MULTILAYER WIRING SUBSTRATE AND MANUFACTURING METHOD THEREOF

CROSS-REFERENCE TO RELATED APPLICATION

This application is a continuation application of International Application PCT/JP2016/053155 filed on Feb. 3, 2016 and designated the U.S., the entire contents of which are incorporated herein by reference.

FIELD

The embodiment discussed herein is related to a capacitor built-in multilayer wiring substrate and a method of manufacturing thereof.

BACKGROUND

In recent years, along with the performance improvement of semiconductor devices in electronic devices, higher speed signal transmission and increased power consumption are becoming a problem. In addition, in order to stably supply power to a semiconductor integrated circuit chip (IC chip), reduction of power supply impedance is strongly demanded on a package substrate.

For example, related technologies are disclosed in Japanese Laid-open Patent Publication No. 2001-267751 or Japanese Laid-open Patent Publication No. 2006-261658.

SUMMARY

According to an aspect of the embodiments, a capacitor built-in multilayer wiring substrate includes: a signal line laminated via, a ground line laminated via, and a power supply line laminated via; a first group of first conductor layers formed at a first wiring layer level and individually and electrically coupled to the signal line laminated via, the ground line laminated via, and the power supply line laminated via; a second conductor layer formed at a second wiring layer level and individually and electrically coupled to at least the power supply line laminated via; a second group of third conductor layers formed at a third wiring layer level and individually and electrically coupled to the signal line laminated via, the ground line laminated via, and the power supply line laminated via; a first insulating layer formed between the first wiring layer level and the second wiring layer level; and a second insulating layer formed between the second wiring layer level and the third wiring layer level, wherein the second insulating layer has a through opening filled with a third insulating layer in a vicinity of the signal line laminated via, a relative dielectric constant of the second insulating layer is higher than relative dielectric constants of the first insulating layer and the third insulating layer, and the through opening reaches a conductor pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

For example, a technique for reducing impedance is a technique of placing a chip capacitor, which is one of passive components, on the front and back surfaces of a package substrate and connecting a power supply line and the GND wiring of the substrate.

In addition, when a wiring length to an IC chip from the capacitor is shortened, the inductance component of the wiring is suppressed and the electric characteristics are improved, and therefore a structure in which the chip capacitor is built in the package substrate and a structure in which a thin film capacitor layer is built in a part of the package substrate have been proposed.

In a case where the thin film capacitor layer is built in the package substrate, a power supply line layer and a GND wiring layer are disposed above and below the thin film capacitor layer and a power supply terminal and a GND terminal of the IC chip are coupled to each other. Since the area of the thin film capacitor layer sandwiched between the power supply line and the GND wiring is proportional to the capacitor value obtained from the thin film capacitor layer, it is preferable that the sandwiched area is large in order to increase the capacitance.

However, in the region where a signal line is provided, there is a harmful effect that the thin film capacitor layer induces additional capacitive coupling with the signal line and deteriorates transmission characteristics. Therefore, it is preferable that the thin film capacitor layer exists only in the region where the power supply line is laid. Therefore, a capacitor built-in package substrate structure has been proposed, in which a thin film capacitor layer is formed of an organic material, which may be patterned by a photolithographic process, or a ceramic material called a green sheet before sintering, and the thin film capacitor layer is sintered after patterning (for example, see Japanese Laid-open Patent Publication No. 2001-267751 or Japanese Laid-open Patent Publication No. 2006-261658).

Figure 26A:
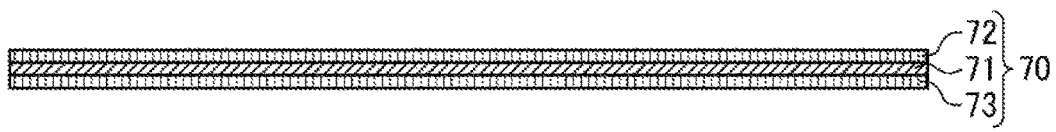
FIGS. 26A to 26D are explanatory diagrams up to the middle of the manufacturing process of the capacitor built-in multilayer wiring substrate.
Figure 26B:
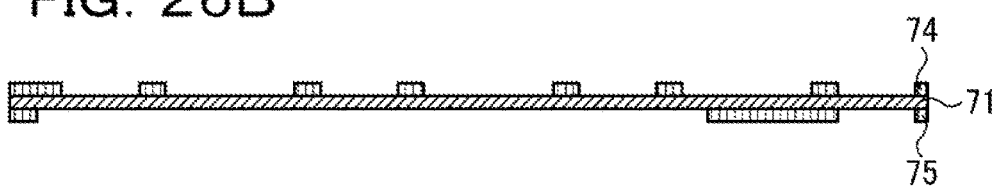
Figure 26C:
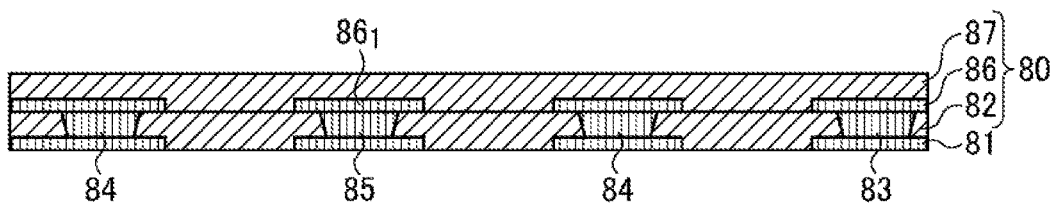

Here, the manufacturing process of the capacitor built-in multilayer wiring substrate will be described with reference to FIGS. 26A to 26D and 27A to 27D. First, as illustrated in FIG. 26A, a capacitor film 70 provided with copper foils 72 and 73 having a thickness of 20 μm on both surfaces of a capacitor dielectric film 71 mainly composed of $BaTiO_3$ having a thickness of 2 μm is prepared. Next, as illustrated in FIG. 26B, the copper foil 72 is etched into a predetermined shape to form an upper electrode 74, and the copper foil 73 is etched to form a lower electrode 25. On the other hand, as illustrated in FIG. 26C, a base substrate 80 provided with a first conductor layer 81, a first insulating layer 82, a power supply line via 83, a ground line via 84, a signal line via 85, second conductor layers 86 and $86_1$, and a second insulating layer 87 is prepared.

Figure 26D:
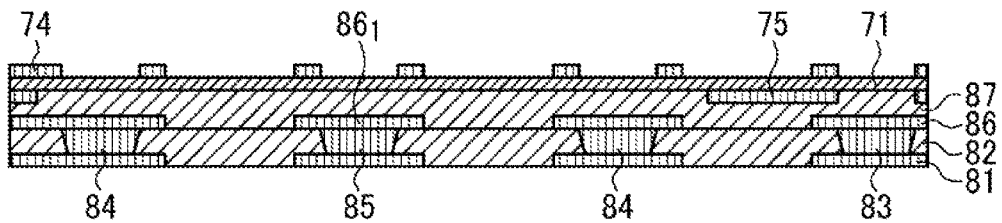

Next, as illustrated in FIG. 26D, the capacitor substrate on which the upper electrode 74 and the lower electrode 75 are formed is pressed against the base substrate 80 with the lower electrode 75 facing the base substrate 80, heated, crimped, and integrated.

Figure 27A:
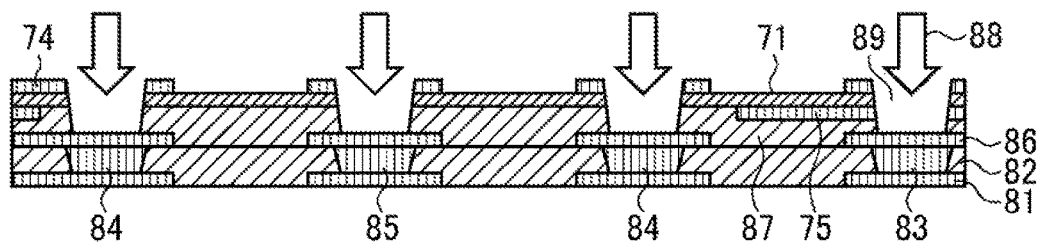
FIGS. 27A to 27D are explanatory diagrams of the manufacturing process of the capacitor built-in multilayer wiring substrate from FIG. 26 and thereafter.
Figure 27B:
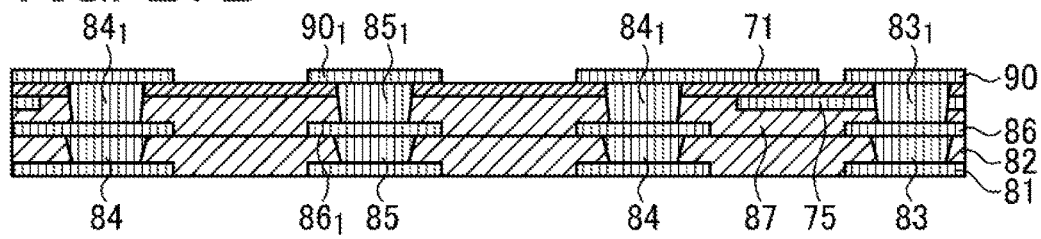

Next, as illustrated in FIG. 27A, by irradiating a laser beam 88 using a $CO_2$ laser having a beam spot diameter of 100 μm from an opening part provided in the upper electrode 74, a via hole 89 reaching each of the second conductor layers 86 and $86_1$ is formed. Next, as illustrated in FIG. 27B, after electroless plating is applied to the wall surface of the via hole 89, Cu electroplating is performed by using a plating frame (not illustrated) provided with a pattern for forming third conductor layers 90 and $90_1$, and a power supply line via $83_1$, a ground line via $84_1$, a signal line via $85_1$, and the third conductor layers 90 and $90_1$ are formed. Further, here, in order to simplify the illustration, illustration of the upper electrode 74 integrated with the third conductor layers 90 and $90_1$ is omitted. In addition, the third conductor layer $90_1$ coupled to the signal line via $85_1$ is a connection conductor pattern for coupling the vias to each other.

Figure 27C:
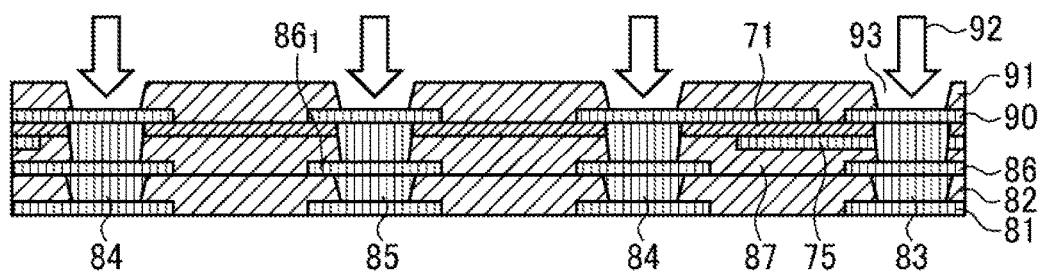

Next, as illustrated in FIG. 27C, a third insulating layer 91 is formed with an insulating film having a thickness of 20 μm mainly composed of an epoxy-based material by using a build-up method. Next, the via hole 93 is formed by irradiating the position facing each of the power supply line via $83_1$, the ground line via $84_1$, and the signal line via $85_1$ with a laser light beam 92 using a $CO_2$ laser having a beam spot diameter of 100 μm.

Figure 27D:
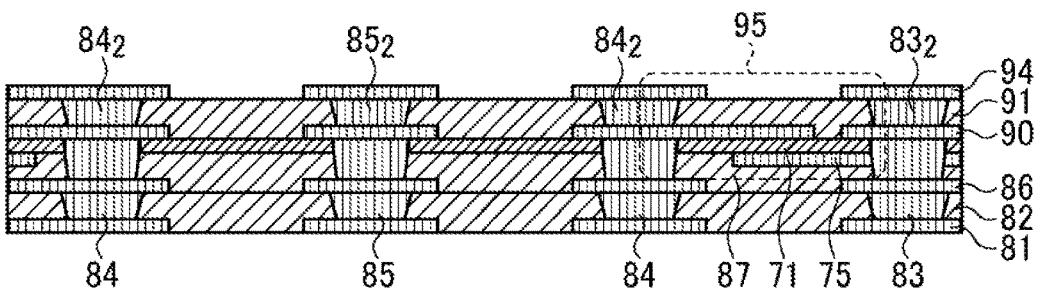

Next, as illustrated in FIG. 27D, after electroless plating is applied, Cu electroplating is performed by using a plating frame (not illustrated) provided with a pattern for forming a fourth conductor layer 94, and a power supply line via $83_2$, a ground line via $84_2$, a signal line via $85_2$, and the fourth conductor layer 94 are formed, thereby completing the basic configuration of the capacitor built-in multilayer wiring substrate.

However, it is difficult for the ceramic material such as $BaTiO_3$ or the like serving as the dielectric film of the capacitor to be patterned to be laid only in the region of the through power supply line after sintering, and the capacitor dielectric film 71 has to be formed on the entire surface of the base substrate 80. A parasitic capacitance using the capacitor dielectric film 71 as a capacitor film is formed between the third conductor layer $90_1$ integrated with the upper electrode coupled to the signal line via $85_1$ and the second conductor layer 86 coupled to the ground line via $84_1$.

Since the dielectric constant of the capacitor dielectric film 71 formed of a ceramic material such as $BaTiO_3$ or the like is high and the C value of the parasitic capacitance unnecessarily increases, a mismatch of characteristic impedance $Z_0$ occurs, and signal transmission deteriorates due to this mismatch.

For example, in a capacitor built-in multilayer wiring substrate in which a sintered ceramic material is laid over the entire surface of the substrate as a thin film capacitor layer and a method of manufacturing the same, deterioration of signal transmission due to parasitic capacitance caused by the capacitor dielectric film in the vicinity of the signal line via may be reduced.

Figure 1A:
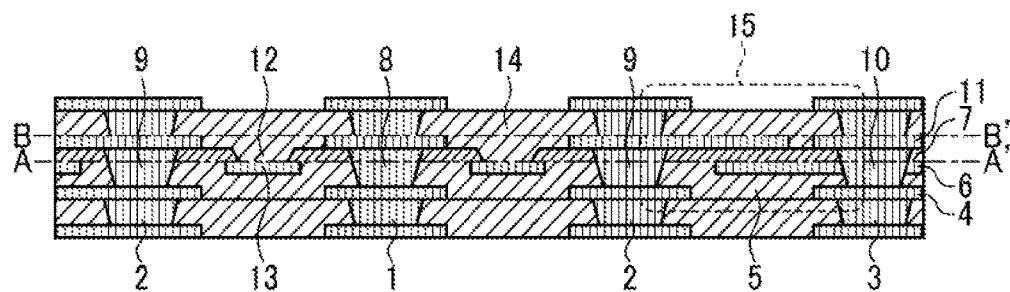
FIGS. 1A to 1C are explanatory diagrams of a capacitor built-in multilayer wiring substrate according to an embodiment of the present disclosure.
Figure 1B:
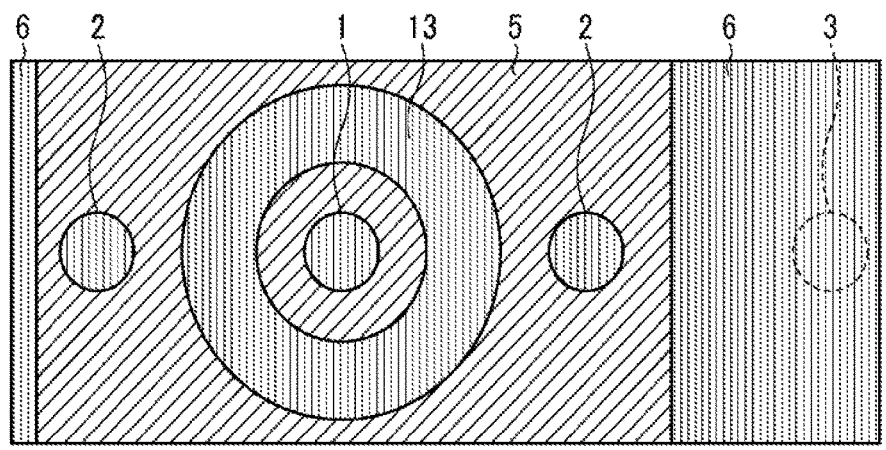
Figure 1C:
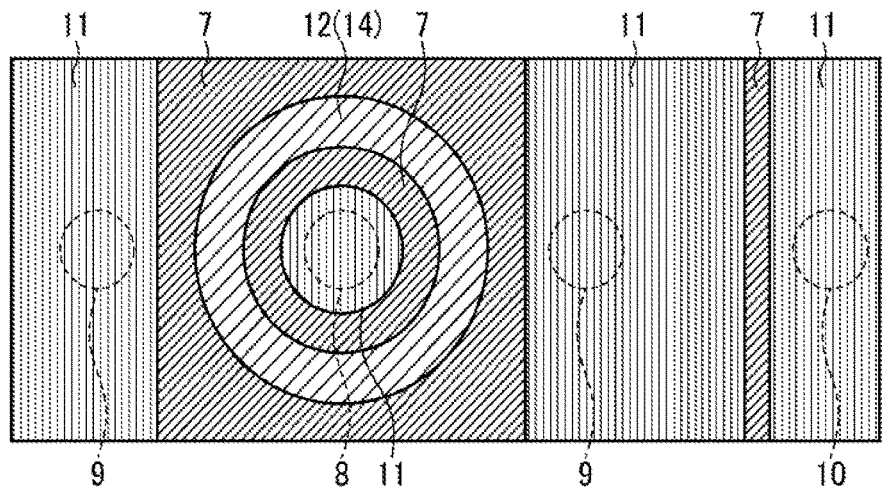

Here, a capacitor built-in multilayer wiring substrate according to an embodiment of the present disclosure will be described with reference to FIGS. 1A to 1C. FIGS. 1A to 1C are an explanatory view of a capacitor built-in multilayer wiring substrate according to an embodiment of the present disclosure, FIG. 1A is a cross-sectional view of a main part, FIG. 1B is a plan view of a second wiring layer level indicated by a dashed line coupling A-A' in FIG. 1A, and FIG. 1C is a perspective plan view of a third wiring layer level indicated by a dashed line coupling B-B' in FIG. 1A. As illustrated in FIG. 1A, on the capacitor built-in multilayer wiring substrate, signal line laminated vias (1, 8), ground line laminated vias (2, 9) and power supply line laminated vias (3, 10) are provided. At the centers of the signal line laminated vias (1, 8), the ground line laminated vias (2, 9) and the power supply line laminated vias (3, 10), a first conductor layer group 4 formed at a first wiring layer level is individually and electrically coupled.

In addition, a second conductor layer 6 formed at the second wiring layer level to be the center of the lower electrode of the capacitor is individually and electrically coupled to the power supply line laminated via (10). In addition, at the centers of the signal line laminated vias (8), the ground line laminated vias (9) and the power supply line laminated vias (10), a third conductor layer group 11 formed at the third wiring layer level is individually and electrically connected.

A first insulating layer 5 is provided between the first wiring layer level and the second wiring layer level, and a second insulating layer 7 serving as a capacitor dielectric film is provided between the second wiring layer level and the third wiring layer level. The second insulating layer 7 is provided with a through opening part 12 in the vicinity of the signal line laminated vias (1, 8), and the through opening part 12 reaches a conductor pattern 13 and is filled with a third insulating layer 14 having a relative dielectric constant smaller than that of the second insulating layer 7. Between a third conductor layer group 11 integrated with the upper wiring coupled to the ground line vias (2, 9) and the second conductor layer 6 coupled to the power supply line vias (3, 10), the second insulating layer 7 serving as a capacitor dielectric film is sandwiched to form a capacitor 15.

Further, the conductor pattern 13 may be an electrically insulated conductor pattern formed at the second wiring layer level or an electrically insulated conductor pattern formed at the first wiring layer level. Alternatively, the conductor pattern 13 may be an overhang portion of a first conductor layer group 4 formed at the first wiring layer level electrically coupled to the ground line laminated via (2). Further, in the case of FIG. 1A, there is an electrically insulated conductor pattern formed at the second wiring layer level together with the lower electrode of the capacitor.

The through opening part 12 is a frame-shaped through opening surrounding the signal line laminated vias (1, 8), in particular, an annular through opening which is typical, but the present disclosure is not limited to such a through opening part having a frame-like shape. For example, the conductor pattern 13 may be a plurality of dotted conductor patterns provided between at least the signal line laminated vias (1, 8) and the ground line laminated vias (2, 9). In that case, as the through opening part 12, a plurality of dotted through opening parts may be provided at positions corresponding to the conductor pattern.

Alternatively, the conductor pattern 13 may be a rectangular conductor pattern having a size larger than the diameter of the signal line laminated vias (1, 8) provided between at least the signal line laminated vias (1, 8) and the ground line laminated vias (2, 9). In this case, a rectangular through opening part having a size larger than the diameter of the signal line laminated vias (1, 8) may be provided at the position corresponding to the conductor pattern 13 as the through opening part 12.

In addition, in the case where the conductor pattern 13 is the overhang portion of the first conductor layer group 4 formed at the first wiring layer level electrically coupled to the ground line laminated via (2), a plurality of dot-shaped through openings may be provided between at least the signal line laminated vias (1, 8) and the grounding line laminated vias (2, 9). Alternatively, the through opening part 12 may be a rectangular through opening part having a size larger than the diameter of the signal line laminated vias (1, 8) provided between at least the signal line laminated vias (1, 8) and the ground line laminated vias (2, 9).

In order to form such a capacitor built-in multilayer wiring substrate, a base substrate provided with at least a first power supply line via 3, a first ground line via 2, and a first signal line via 1, a first conductor layer group 4 electrically independently coupled to the first power supply line via 3, the first ground line via 2, and the first signal line via 1, and the first insulating layer 5 provided on the first conductor layer group 4 is prepared. A capacitor substrate provided with a second conductor pattern on one surface of the second insulating layer 7 and a third conductor pattern on the other surface is stacked on the base substrate and integrated to form the second conductor pattern as the second conductor layer 6.

Next, a second power supply line via 10, a second ground line via 9, and a second signal line via 8 coupled to the first conductor layer group 4, and the third conductor layer group 11 electrically independently coupled to the second power supply line via 10, the second ground line via 9, and the second signal line via 8 are formed. Further, the third conductor layer group 11 is integrated with the third conductor pattern provided on the capacitor substrate.

Next, in the vicinity of the second signal line via 8, the through opening 12 is formed in the second insulating layer 7 to reach the conductor pattern 13 provided under the second insulating layer 7, and the through opening 12 is filled with the third insulating layer 14 having a relative dielectric constant smaller than that of the second insulating layer 7.

Typically, the through opening 12 is formed by laser processing using a $CO_2$ laser or an ultraviolet laser having a beam spot diameter of 50 μm to 100 μm, but since the conductor pattern 13 is provided in the lower portion, the base substrate is not damaged. In the case of precisely controlling laser irradiation during the laser processing, the bottom surface of the through opening 12 may be in contact with the insulating layer (the first insulating layer 5 in the case of FIGS. 1A to 1C) on the surface of the base substrate.

Typically, the second conductor pattern and the third conductor pattern provided on the capacitor substrate are selected from aluminum, nickel, copper and the like and have a thickness of 15 μm to 30 μm. In addition, typically, the second insulating layer 7 is a sintered thin film having a thickness of 1 μm to 3 μm mainly composed of $BaTiO_3$, $SrTiO_3$ or the like. In addition, the diameters of the signal line laminated vias (1, 8), the ground line laminated vias (2, 9) and the power supply line laminated vias (3, 10) are 50 μm to 100 μm.

As the third insulating layer 14, an epoxy resin or the like having a relative dielectric constant smaller than that of the second insulating layer 7 is used, and the thickness thereof is set to 20 μm to 30 μm. Since the through opening part 12 is filled with an epoxy resin or the like having a small relative dielectric constant, the effective dielectric constant of the capacitor film of the parasitic capacitor is lowered, and the parasitic capacitance near the signal line is reduced.

As described above, according to the embodiment of the present disclosure, since a part of the second insulating layer serving as the capacitor film is removed between the signal line and the ground line, additional increase in parasitic capacitance is avoided. As a result, high-quality signal transmission with matched characteristic impedance becomes possible. In addition, when removing a part of the second insulating layer, since the conductor pattern is provided at the bottom of the removed portion, the base substrate is not damaged.

Embodiment 1

Figure 2A:
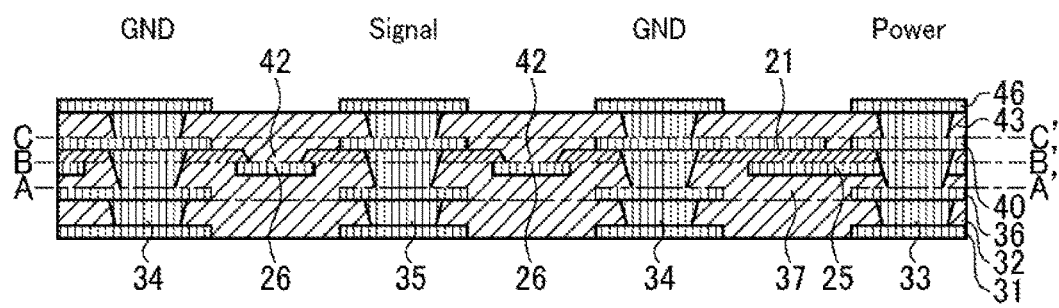
FIGS. 2A and 2B are explanatory diagrams (1) of the capacitor built-in multilayer wiring substrate according to an embodiment 1 of the present disclosure.
Figure 2B:
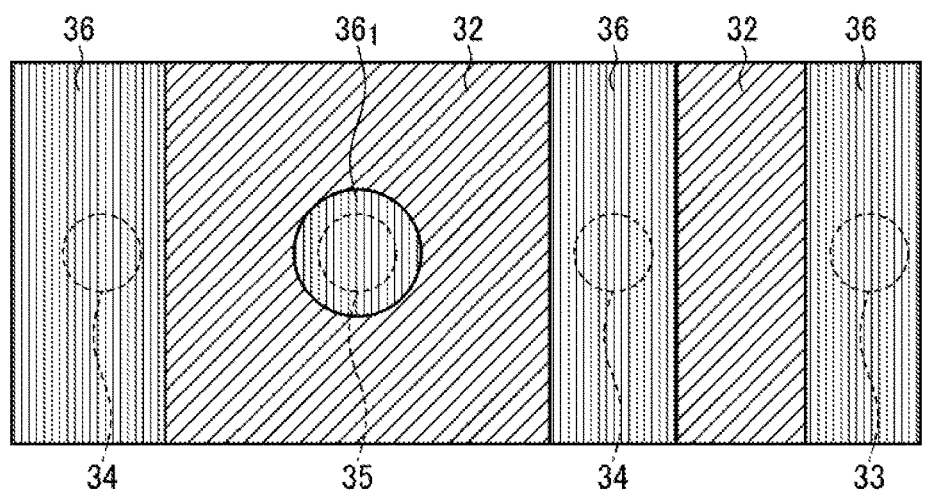
Figure 3A:
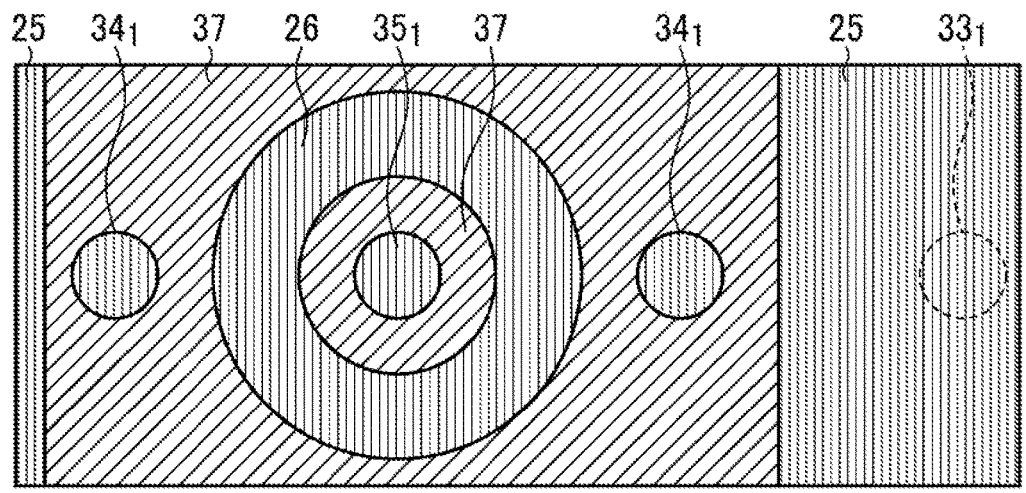
FIGS. 3A and 3B are explanatory diagrams (2) of the capacitor built-in multilayer wiring substrate according to the embodiment 1 of the present disclosure.
Figure 3B:
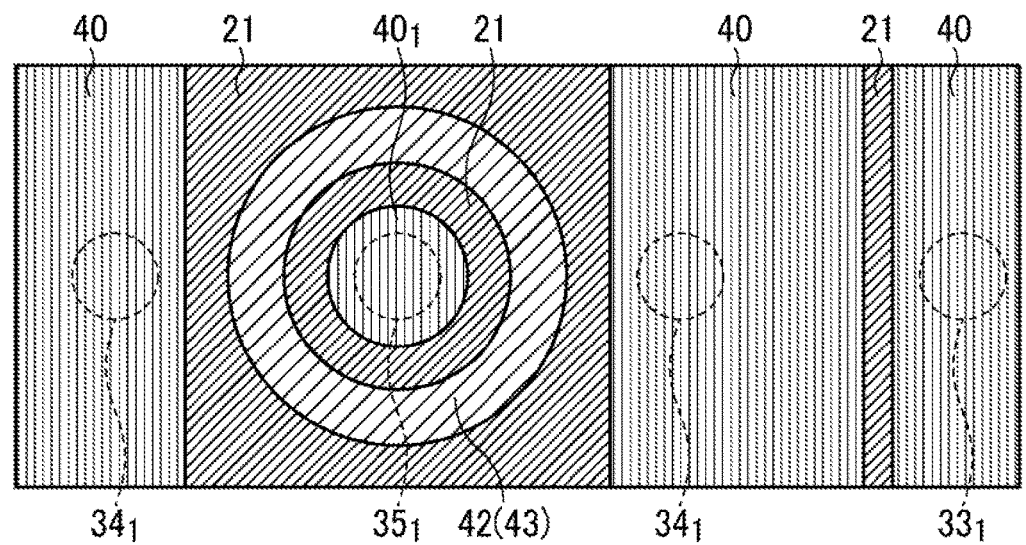

Next, a capacitor built-in multilayer wiring substrate according to Embodiment 1 of the present disclosure will be described with reference to FIGS. 2A to 6C. FIGS. 2A and 2B and 3A and 3B are explanatory diagrams of a capacitor built-in multilayer wiring substrate of the embodiment 1 of the present disclosure, FIG. 2A is a cross-sectional view of a main part, FIG. 2B is a plan view at the time of forming the second conductor layer taken along a one-dot chain line connecting A-A' in FIG. 2A, FIG. 3A is a plan view of the position of the lower electrode taken along a one-dot chain line connecting B-B' in FIG. 2A, and FIG. 3B is a plan view of the position of the third conductor layer immediately after the formation of the third insulating layer taken along a one-dot chain line connecting C-C' in FIG. 2A. As illustrated in FIG. 2A, a capacitor dielectric film 21 is sandwiched between a third conductor layer 40 integrated with the upper wiring coupled to a ground line via 34 and the lower electrode 25 coupled to a power supply line via 33 to form a capacitor.

As illustrated in FIG. 2B, a second conductor layer 36 connected to the power supply line via 33 and the ground line via 34 is a solid pattern, and a second conductor layer $36_1$ coupled to a signal line via 35 is a connection conductor pattern for coupling the vias to each other, which are circular in the drawing. As illustrated in FIG. 3A, the lower electrode 25 coupled to a power supply line via $33_1$ is a solid pattern, and an annular isolated conductor layer 26 surrounding a signal line via $35_1$ is formed by using a copper foil (reference numeral 23 in FIG. 4A to be described later) forming the lower electrode 25.

As illustrated in FIG. 3B, the third conductor layer 40 coupled to the power supply line via $33_1$ and a ground line via $34_1$ is a solid pattern, a dielectric film separating groove 42 is provided at a position corresponding to the isolated conductor layer 26, and the capacitor dielectric film 21 is divided. Further, the third conductor layer $40_1$ coupled to the signal line via $35_1$ is a connection conductor pattern for coupling the vias to each other.

Figure 4A:
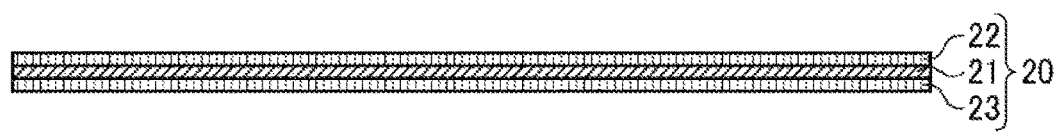
FIGS. 4A to 4D are explanatory diagrams up to the middle of a manufacturing process of the capacitor built-in multilayer wiring substrate according to the embodiment 1 of the present disclosure.
Figure 4B:
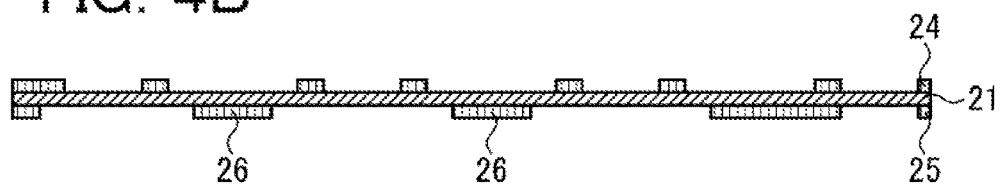
Figure 4C:
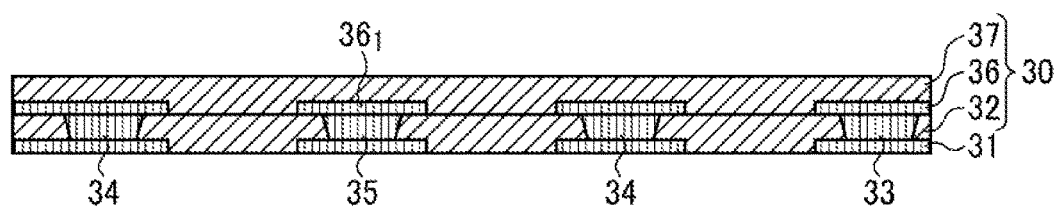

Next, a manufacturing process of the capacitor built-in multilayer wiring substrate according to the embodiment 1 of the present disclosure will be described with reference to FIGS. 4A to 6C. First, as illustrated in FIG. 4A, a capacitor film 20 provided with copper foils 22 and 23 having a thickness of 20 μm on both surfaces of the capacitor dielectric film 21 mainly composed of $BaTiO_3$ having a thickness of 2 μm is prepared. Next, as illustrated in FIG. 4B, the copper foil 22 is etched into a predetermined shape to form the upper electrode 24 and the copper foil 23 is etched to form the lower electrode 25 and the isolated conductor layer 26 having the pattern illustrated in FIG. 3A. On the other hand, as illustrated in FIG. 4C, a base substrate 30 provided with a first conductor layer 31, a first insulating layer 32, a power supply line via 33, a ground line via 34, a signal line via 35, second conductor layers 36 and $36_1$, and a second insulating layer 37 is prepared. Further, the second conductor layers 36 and $36_1$ are the patterns illustrated in FIG. 2B.

Figure 4D:
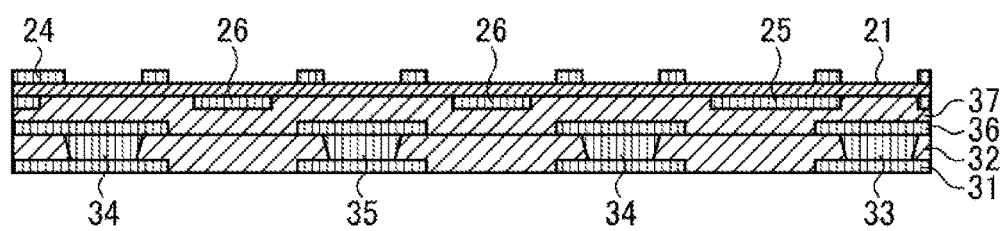

Next, as illustrated in FIG. 4D, the capacitor substrate on which the upper electrode 24, the lower electrode 25, and the isolated conductor layer 26 are formed on the base substrate 30 is pressed with the lower electrode 25 facing the base substrate 30, heated, and crimped to be integrated.

Figure 5A:
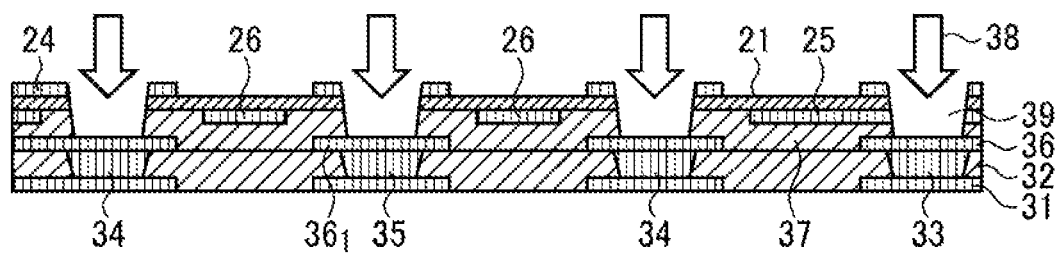
FIGS. 5A to 5C are explanatory diagrams up to the middle of the manufacturing process of the capacitor built-in multilayer wiring substrate according to the embodiment 1 of the present disclosure from FIG. 4 and thereafter.
Figure 5B:
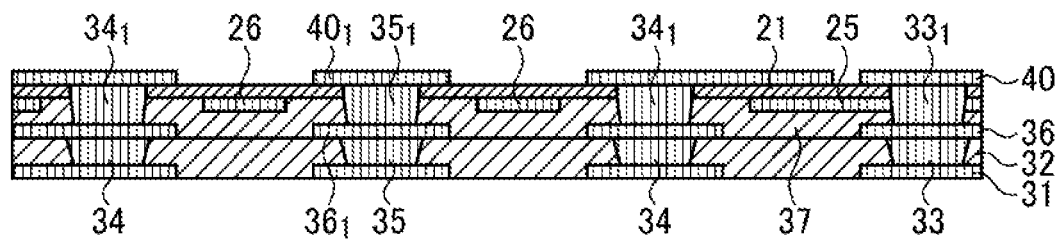

Next, as illustrated in FIG. 5A, by irradiating a laser beam 38 using a $CO_2$ laser having a beam spot diameter of 100 μm from an opening provided in the upper electrode 24, the via hole 39 reaching the second conductor layers 36 and $36_1$ is formed. Next, as illustrated in FIG. 5B, after electroless plating is applied to the wall surface of the via hole 39, Cu electroplating is performed by using a plating frame (not illustrated) provided with a pattern for forming the third conductor layers 40 and $40_1$ to form the power supply line via $33_1$, the ground line via $34_1$, the signal line via $35_1$, and the third conductor layers 40 and $40_1$. Here, in order to simplify the illustration, illustration of the upper electrode 24 integrated with the third conductor layers 40 and $40_1$ is omitted (the same applies below). Further, the third conductor layer $40_1$ coupled to the signal line via $35_1$ is a connection conductor pattern for coupling the vias to each other.

Figure 5C:
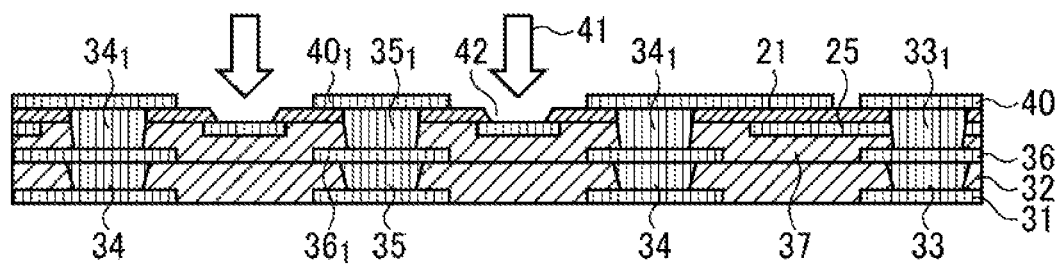

Next, as illustrated in FIG. 5C, a position facing the isolated conductor layer 26 is irradiated again with a laser beam 41 using a $CO_2$ laser having a beam spot diameter of 100 μm to form the annular dielectric film separating groove 42 illustrated in FIG. 3B. At this time, since the isolated conductor layer 26 is disposed under the laser-irradiated portion, the surface of the base substrate (30) is not damaged.

Figure 6A:
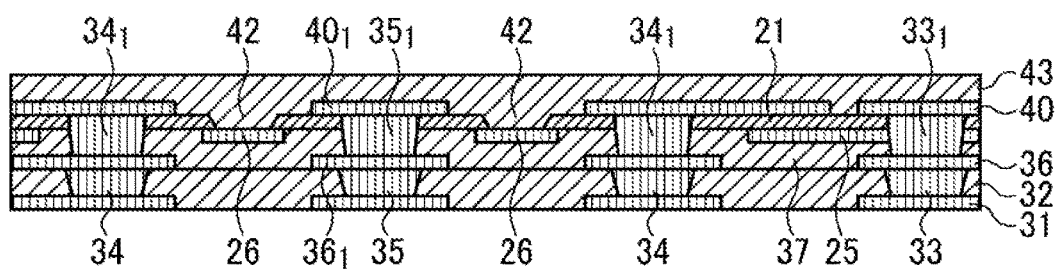
FIGS. 6A to 6C are explanatory diagrams of the manufacturing process of the capacitor built-in multilayer wiring substrate according to the embodiment 1 of the present disclosure from FIG. 5 and thereafter.
Figure 6B:
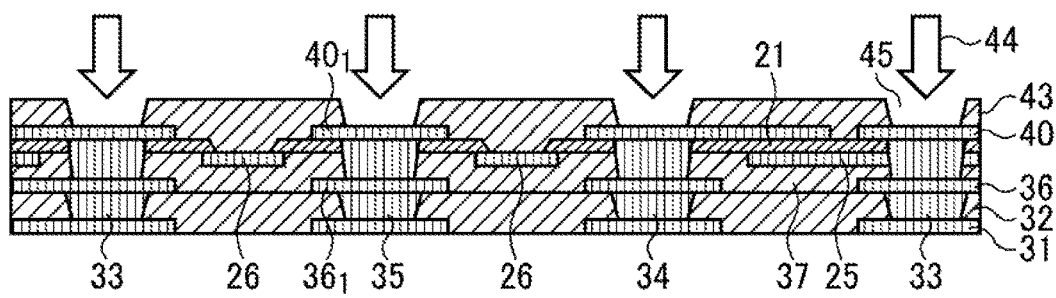

Hereinafter, again as illustrated in FIG. 6A, a third insulating layer 43 is formed with an insulating film having a thickness of 20 μm mainly composed of an epoxy-based material by using a build-up method. Next, as illustrated in FIG. 6B, a via hole 45 is formed by irradiating the position facing the power supply line via $33_1$, the ground line via $34_1$, and the signal line via $35_1$ with a laser beam 44 using a $CO_2$ laser having a beam spot diameter of 100 μm.

Figure 6C:
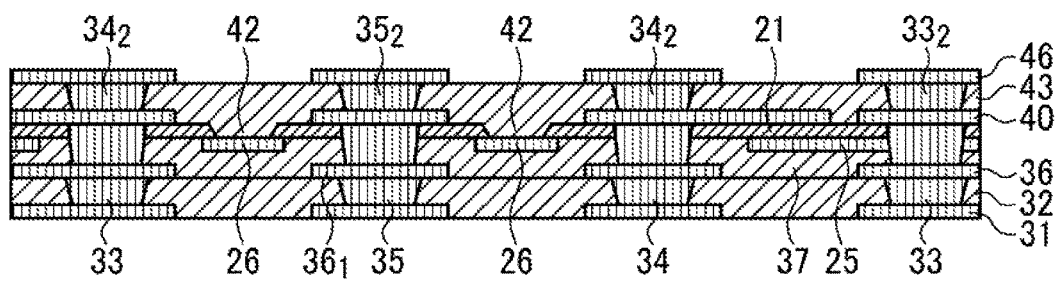

Next, as illustrated in FIG. 6C, after electroless plating is applied, Cu electroplating is performed by using a plating frame (not illustrated) provided with a pattern for forming the fourth conductor layer 46 to form a power supply line via $33_2$, a ground line via $34_2$, a signal line via $35_2$, and the fourth conductor layer 46, thereby completing the basic configuration of the capacitor built-in multilayer wiring substrate.

In the embodiment 1 of the present disclosure, a part of the capacitor dielectric film 21 in the vicinity of the signal line via $35_1$ is removed annularly to form a dielectric film separating groove 42, and this dielectric film separating groove 42 is filled with an epoxy resin having a relative dielectric constant smaller than that of the capacitor dielectric film 21. Therefore, it is possible to reduce the parasitic capacitance of the parasitic capacitor as compared with the case where the dielectric film separating groove 42 is not formed. In addition, in the embodiment 1 of the present disclosure, since the annular isolated conductor layer 26 is formed by utilizing the copper foil 23 for forming the lower electrode 25, the surface of the base substrate 30 is not damaged by the laser irradiation when the dielectric film separating groove 42 is formed.

Embodiment 2

Figure 7A:
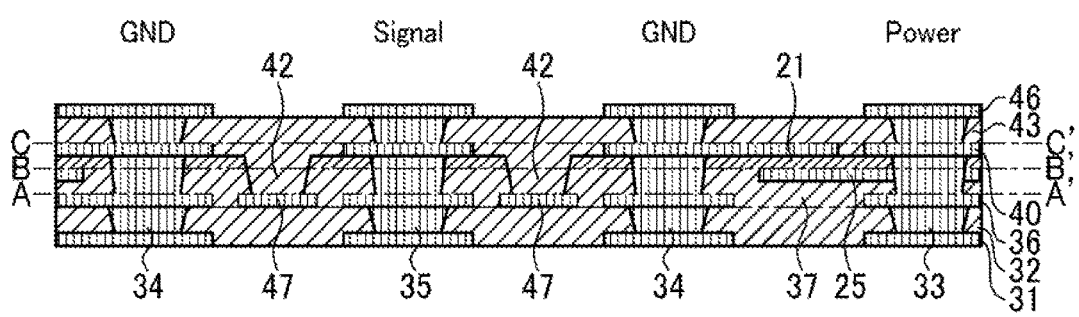
FIGS. 7A and 7B are explanatory diagrams (1) of a capacitor built-in multilayer wiring substrate according to an embodiment 2 of the present disclosure.
Figure 7B:
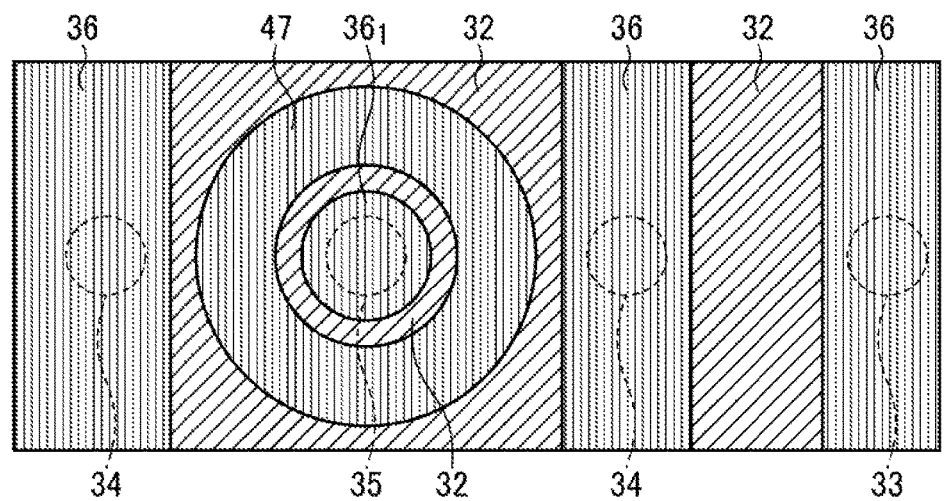
Figure 8A:
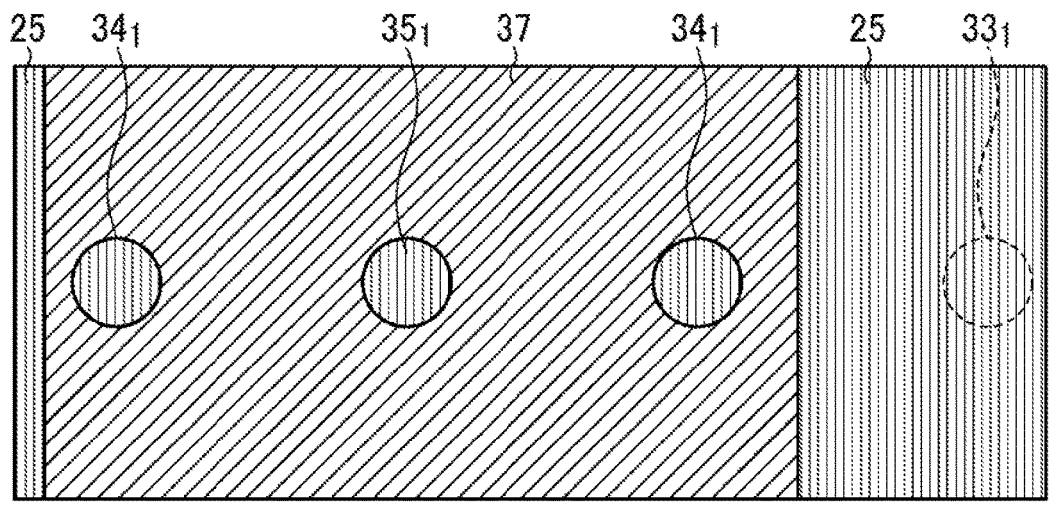
FIGS. 8A and 8B are explanatory diagrams (2) of the capacitor built-in multilayer wiring substrate according to the embodiment 2 of the present disclosure.
Figure 8B:
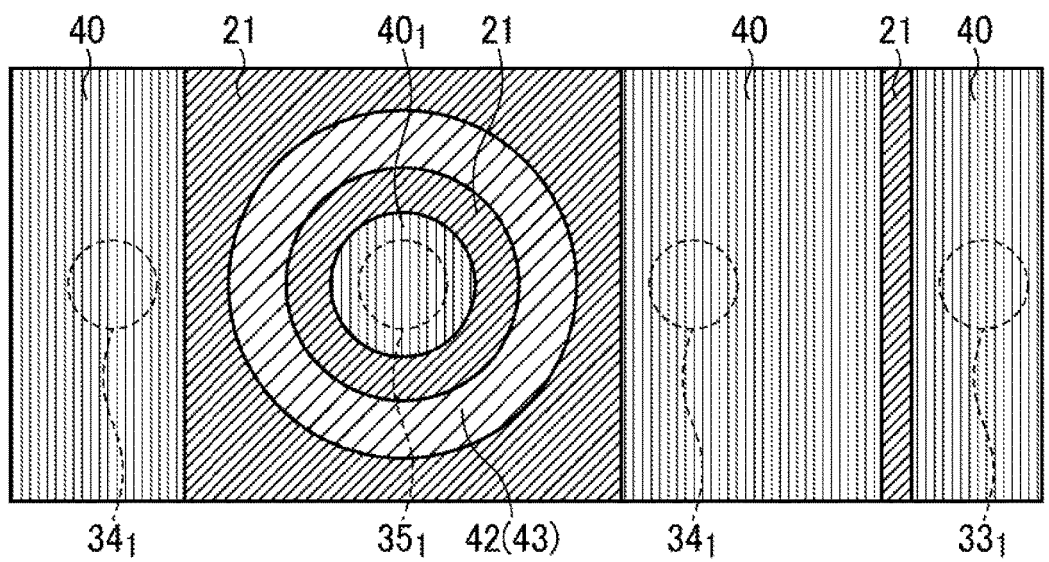

Next, a capacitor built-in multilayer wiring substrate according to the embodiment 2 of the present disclosure will be described with reference to FIGS. 7A to 11C. FIGS. 7A and 7B and 8A and 8B are explanatory diagrams of a capacitor built-in multilayer wiring substrate according to the embodiment 2 of the present disclosure, FIG. 7A is a cross-sectional view of a main part, FIG. 7B is a plan view at the time of forming the second conductor layer taken along a one-dot chain line connecting A-A' in FIG. 7A, FIG. 8A is a plan view before generating the dielectric film separating groove taken along a one-dot chain line connecting B-B' in FIG. 7A, and FIG. 8B is a plan view of the position of the third conductor layer immediately after the formation of the third insulating layer taken along a one-dot chain line connecting C-C' in FIG. 7A. As illustrated in FIG. 7A, similarly to the embodiment 1, the capacitor dielectric film 21 is sandwiched between the third conductor layer 40 integrated with the upper wiring coupled to the ground line via 34 and the lower electrode 25 coupled to the power supply line via 33 to form a capacitor.

As illustrated in FIG. 7B, the second conductor layer 36 coupled to the power supply line via 33 and the ground line via 34 is a solid pattern, and a second conductor layer $36_1$ coupled to the signal line via 35 is a connection conductor pattern for coupling the vias to each other. An annular isolated conductor layer 47 surrounding the signal line via $35_1$ is formed when the second conductor layer 36 is formed.

As illustrated in FIG. 8A, the lower electrode 25 coupled to the power supply line via $33_1$ is a solid pattern. As illustrated in FIG. 8B, the third conductor layer 40 coupled to the power supply line via $33_1$ and a ground line via $34_1$ is a solid pattern, a dielectric film separating groove 42 is provided at a position corresponding to the isolated conductor layer 47, and the capacitor dielectric film 21 is divided. Further, the third conductor layer $40_1$ connected to the signal line via $35_1$ is a connection conductor pattern for coupling the vias to each other.

Figure 9A:
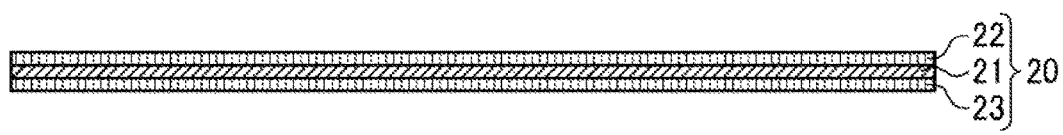
FIGS. 9A to 9D are explanatory diagrams up to the middle of the manufacturing process of the capacitor built-in multilayer wiring substrate according to the embodiment 2 of the present disclosure.
Figure 9B:
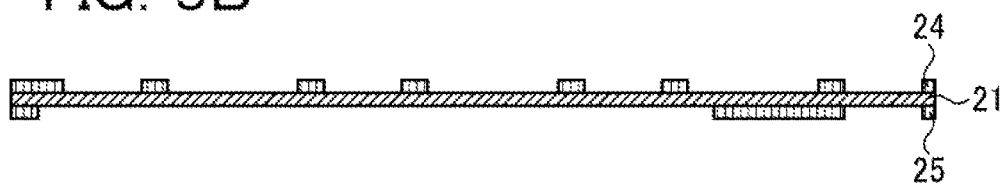

Next, a manufacturing process of the capacitor built-in multilayer wiring substrate according to the embodiment 2 of the present disclosure will be described with reference to FIGS. 9A to 11C. First, as illustrated in FIG. 9A, a capacitor film 20 provided with copper foils 22 and 23 having a thickness of 20 µm on both surfaces of the capacitor dielectric film 21 mainly composed of $BaTiO_3$ having a thickness of 2 µm is prepared. Next, as illustrated in FIG. 9B, the copper foil 22 is etched into a predetermined shape to form the upper electrode 24 and the copper foil 23 is etched to form the lower electrode 25 having the pattern illustrated in FIG. 8A. In the case of the embodiment 2, no isolated conductor layer is formed on the capacitor film side.

Figure 9C:
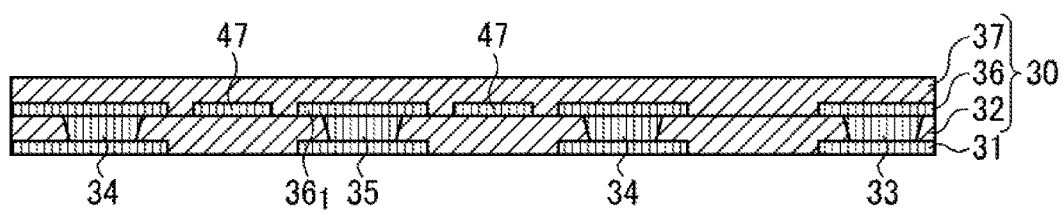

On the other hand, as illustrated in FIG. 9C, a base substrate 30 provided with a first conductor layer 31, a first insulating layer 32, a power supply line via 33, a ground line via 34, a signal line via 35, second conductor layers 36 and $36_1$, and a second insulating layer 37 is prepared. At this time, when forming the second conductor layers 36 and $36_1$, as illustrated in FIG. 7B, the annular isolated conductor layer 47 surrounding the signal line via 35 is formed.

Figure 9D:
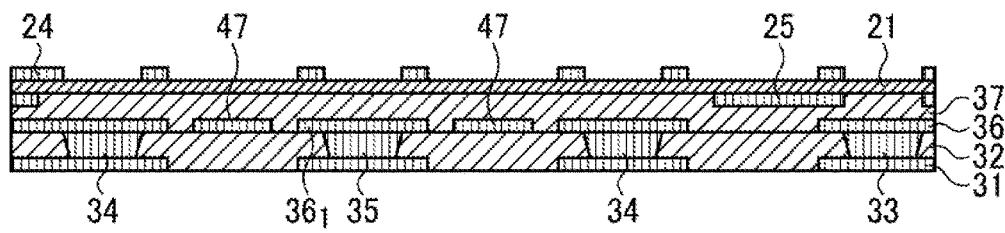

Next, as illustrated in FIG. 9D, the capacitor substrate on which the upper electrode 24 and the lower electrode 25 are formed on the base substrate 30 is pressed with the lower electrode 25 facing the base substrate 30, heated, and crimped to be integrated.

Figure 10A:
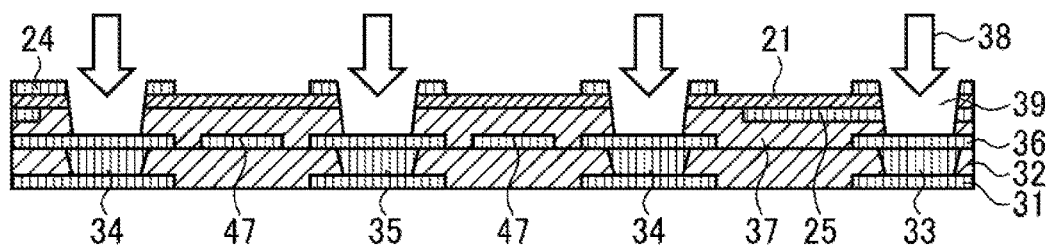
FIGS. 10A to 10C are explanatory diagrams up to the middle of the manufacturing process of the capacitor built-in multilayer wiring substrate according to the embodiment 2 of the present disclosure from FIG. 9 and thereafter.
Figure 10B:
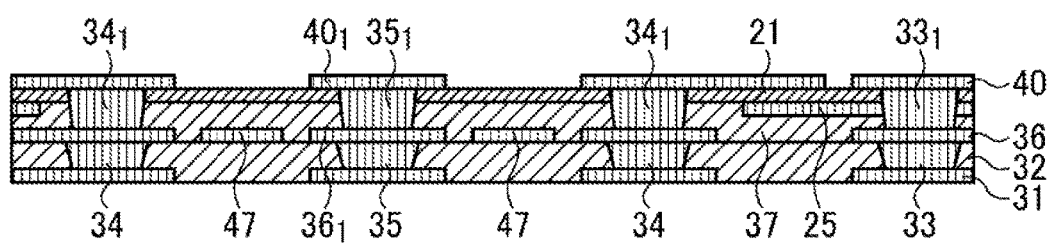

Next, as illustrated in FIG. 10A, by irradiating a laser beam 38 using a $CO_2$ laser having a beam spot diameter of 100 µm from an opening provided in the upper electrode 24, the via hole 39 reaching the second conductor layers 36 and $36_1$ is formed. Next, as illustrated in FIG. 10B, after electroless plating is applied to the wall surface of the via hole 39, Cu electroplating is performed by using a plating frame (not illustrated) provided with a pattern for forming the third conductor layers 40 and $40_1$ to form the power supply line via $33_1$, the ground line via $34_1$, the signal line via $35_1$, and the third conductor layers 40 and $40_1$. Further, here, in order to simplify the illustration, illustration of the upper electrode 24 integrated with the third conductor layers 40 and $40_1$ is omitted.

Figure 10C:
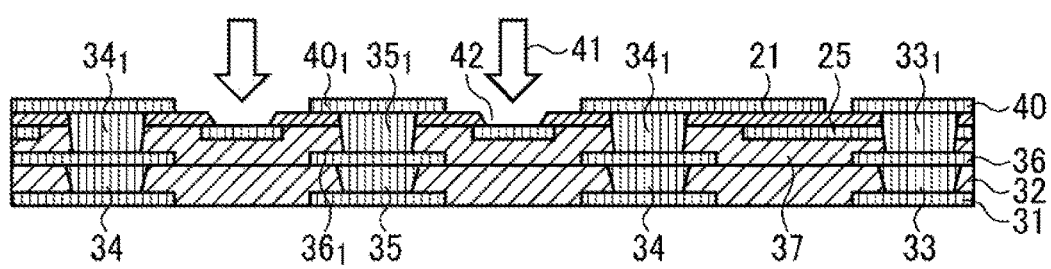

Next, as illustrated in FIG. 10C, a position facing the isolated conductor layer 47 is irradiated again with a laser beam 41 using a $CO_2$ laser having a beam spot diameter of 100 µm to form the annular dielectric film separating groove 42 illustrated in FIG. 8B. At this time, since the isolated conductor layer 47 is disposed under the laser-irradiated portion, the surface of the base substrate (30) is not damaged.

Figure 11A:
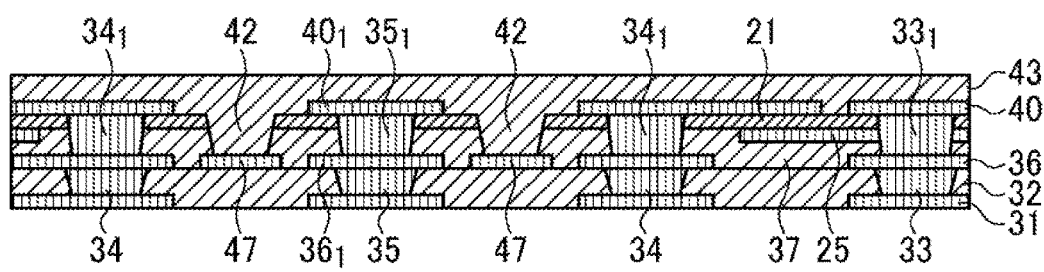
FIGS. 11A to 11C are explanatory diagrams of the manufacturing process of the capacitor built-in multilayer wiring substrate according to the embodiment 2 of the present disclosure from FIG. 10 and thereafter.
Figure 11B:
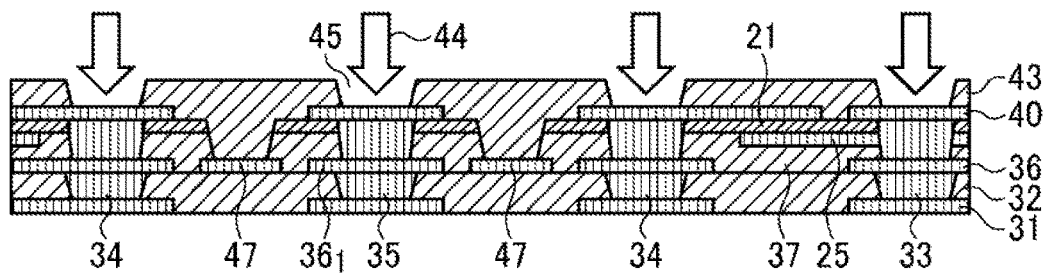

Hereinafter, again as illustrated in FIG. 11A, a third insulating layer 43 is formed with an insulating film having a thickness of 20 µm mainly composed of an epoxy-based material by using a build-up method. Next, as illustrated in FIG. 11B, a via hole 45 is formed by irradiating the position facing the power supply line via $33_1$, the ground line via $34_1$, and the signal line via $35_1$ with a laser beam 44 using a $CO_2$ laser having a beam spot diameter of 100 µm.

Figure 11C:
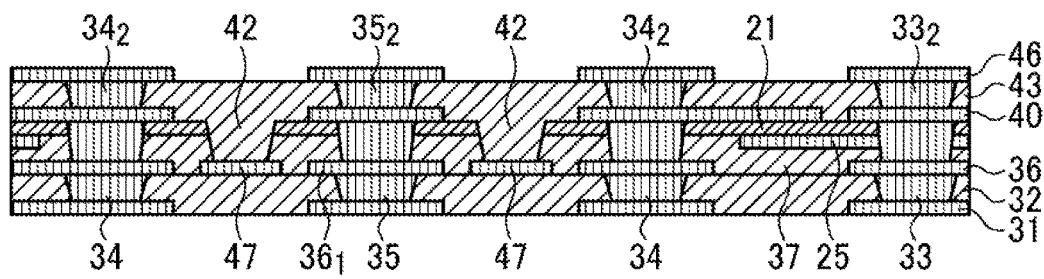

Next, as illustrated in FIG. 11C, after electroless plating is applied, Cu electroplating is performed by using a plating frame (not illustrated) provided with a pattern for forming the fourth conductor layer 46 to form a power supply line via $33_2$, a ground line via $34_2$, a signal line via $35_2$, and the fourth conductor layer 46, thereby completing the basic configuration of the capacitor built-in multilayer wiring substrate.

In the embodiment 2 of the present disclosure, a part of the capacitor dielectric film 21 in the vicinity of the signal line via $35_1$ is removed annularly to form a dielectric film separating groove 42, and this dielectric film separating groove 42 is filled with an epoxy resin having a dielectric constant smaller than that of the capacitor dielectric film 21. Therefore, it is possible to reduce the parasitic capacitance of the parasitic capacitor as compared with the case where the dielectric film separating groove 42 is not formed. In addition, since the annular isolated conductor layer 47 is formed at the same time as the second conductor layer 36, the surface of the base substrate 30 is not damaged by the laser irradiation when the dielectric film separating groove 42 is formed.

Embodiment 3

Figure 12A:
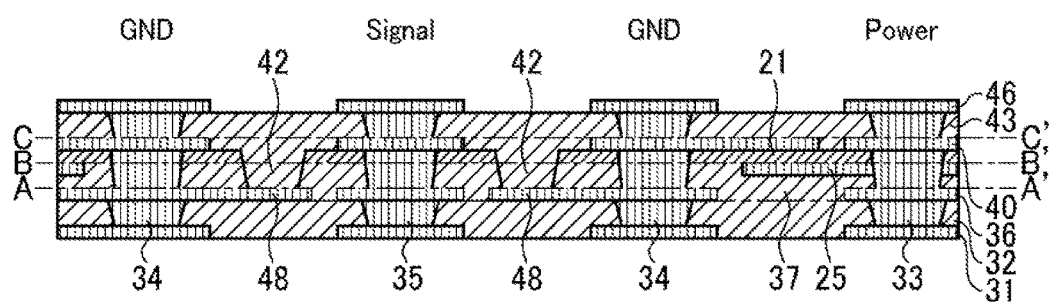
FIGS. 12A and 12B are explanatory diagrams (1) of a capacitor built-in multilayer wiring substrate according to an embodiment 3 of the present disclosure.
Figure 12B:
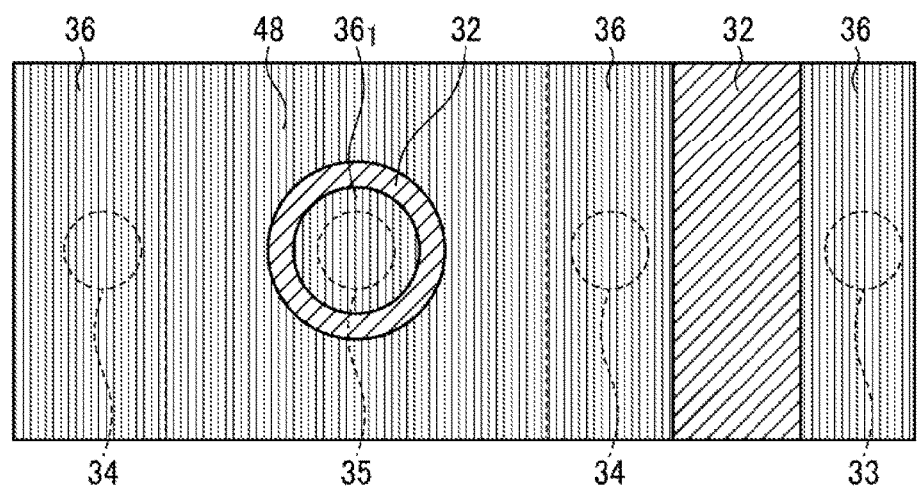
Figure 13A:
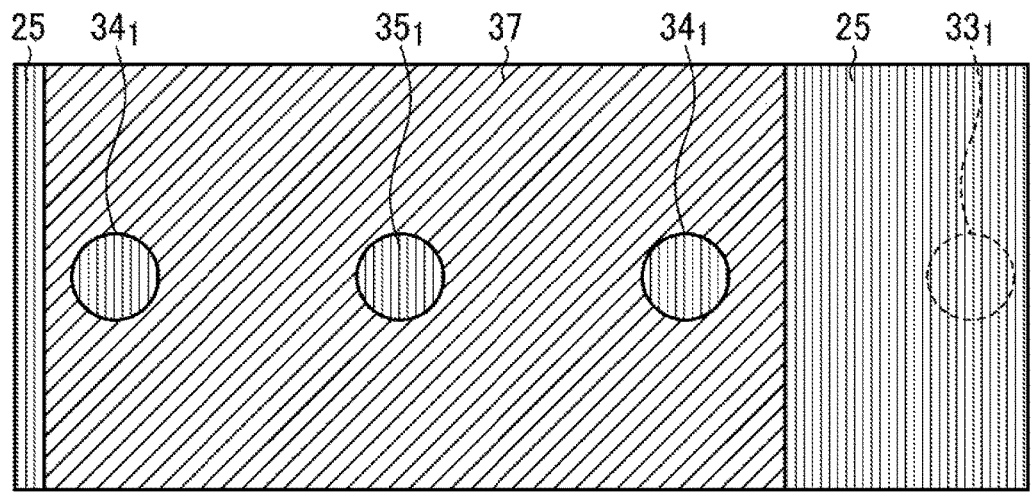
FIGS. 13A and 13B are explanatory diagrams (2) of the capacitor built-in multilayer wiring substrate according to the embodiment 3 of the present disclosure.
Figure 13B:
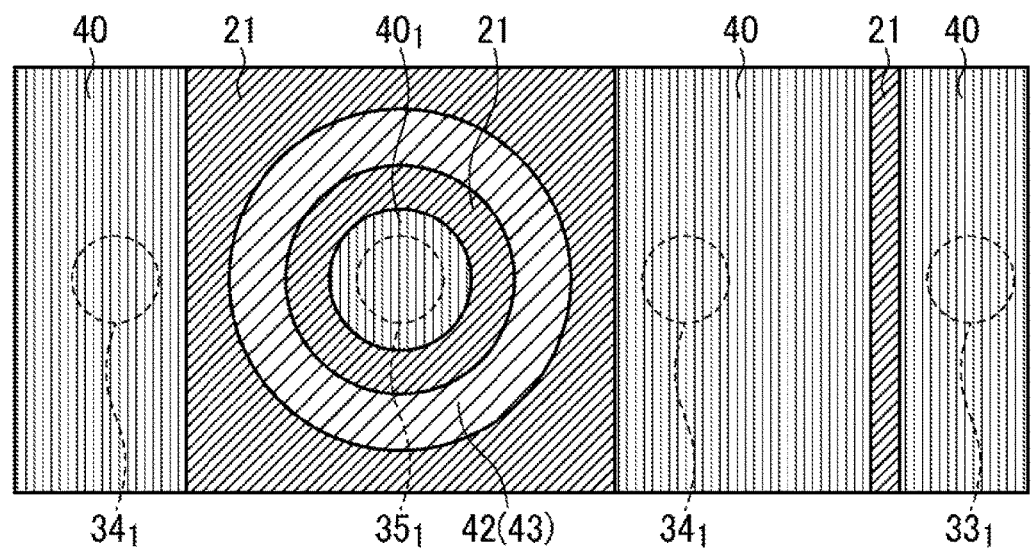

Next, a capacitor built-in multilayer wiring substrate according to the embodiment 3 of the present disclosure will be described with reference to FIGS. 12A to 13B, but since the manufacturing process is exactly the same as that of the above-described the embodiment 2 except that an overhang portion 48 is provided instead of providing the isolated conductor layer 47, only the structure will be described. FIGS. 12A to 13B are explanatory diagram of a capacitor built-in multilayer wiring substrate according to the embodiment 3 of the present disclosure, FIG. 12A is a cross-sectional view of a main part, FIG. 12B is a plan view at the time of forming the second conductor layer taken along a one-dot chain line connecting A-A' in FIG. 12A, FIG. 13A is a plan view of the lower electrode position before formation of the dielectric film separating groove taken along a one-dot chain line connecting B-B' in FIG. 12A, and FIG. 13B is a plan view of the position of the third conductor layer immediately after the formation of the third insulating layer taken along a one-dot chain line connecting C-C' in FIG. 12A. As illustrated in FIG. 12A, similarly to the embodiment 2, the capacitor dielectric film 21 is sandwiched between the third conductor layer 40 integrated with the upper wiring coupled to the ground line via 34 and the lower electrode 25 coupled to the power supply line via 33 to form a capacitor.

As illustrated in FIG. 12B, the second conductor layer 36 coupled to the power supply line via 33 and the ground line via 34 is a solid pattern, and a second conductor layer $36_1$ coupled to the signal line via 35 is a connection conductor pattern for coupling the vias to each other. The overhang portion 48 of the second conductor layer 36 surrounds the signal line via $35_1$.

As illustrated in FIG. 13A, the lower electrode 25 coupled to the power supply line via $33_1$ is a solid pattern. As illustrated in FIG. 13B, the third conductor layer 40 coupled to the power supply line via $33_1$ and a ground line via $34_1$ is a solid pattern, a dielectric film separating groove 42 is provided at a position where the overhang portion 48 extends, and the capacitor dielectric film 21 is divided. Further the third conductor layer $40_1$ coupled to the signal line via $35_1$ is a connection conductor pattern for coupling the vias to each other.

In the embodiment 3 of the present disclosure, a part of the capacitor dielectric film 21 in the vicinity of the signal line via $35_1$ is removed in a ring shape to form a dielectric film separating groove 42, and this dielectric film separating groove 42 is filled with an epoxy resin having a dielectric constant smaller than that of the capacitor dielectric film 21. Therefore, it is possible to reduce the parasitic capacitance of the parasitic capacitor as compared with the case where the dielectric film separating groove 42 is not formed. In addition, in the embodiment 3 of the present disclosure, since the overhang portion 48 of the second conductor layer 36 is formed toward the signal line via 35, the surface of the base substrate 30 is not damaged by the laser irradiation when the dielectric film separating groove 42 is formed.

Embodiment 4

Figure 14A:
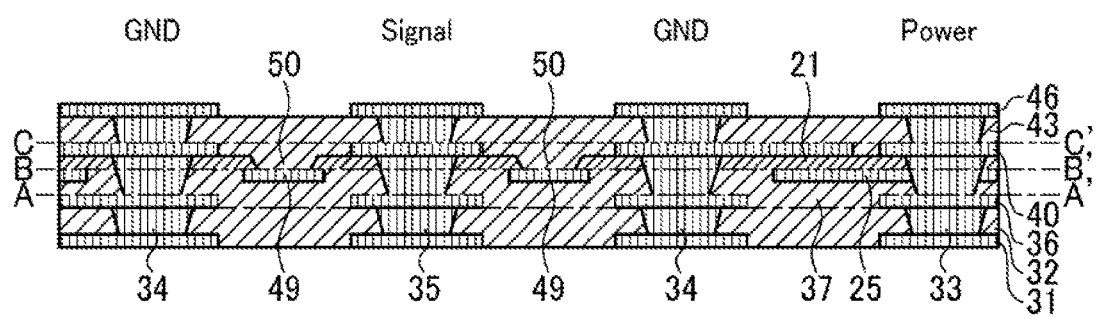
FIGS. 14A and 14B are explanatory diagrams (1) of a capacitor built-in multilayer wiring substrate according to an embodiment 4 of the present disclosure.
Figure 14B:
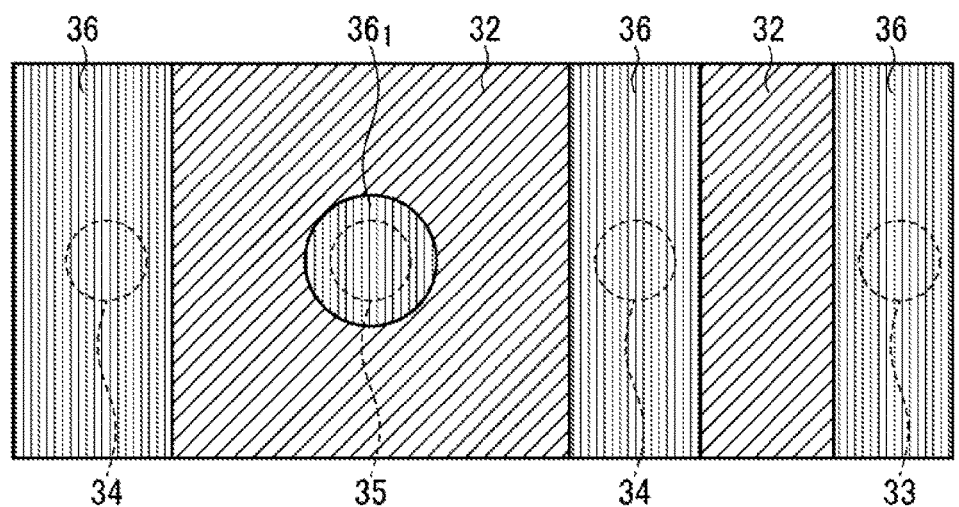
Figure 15A:
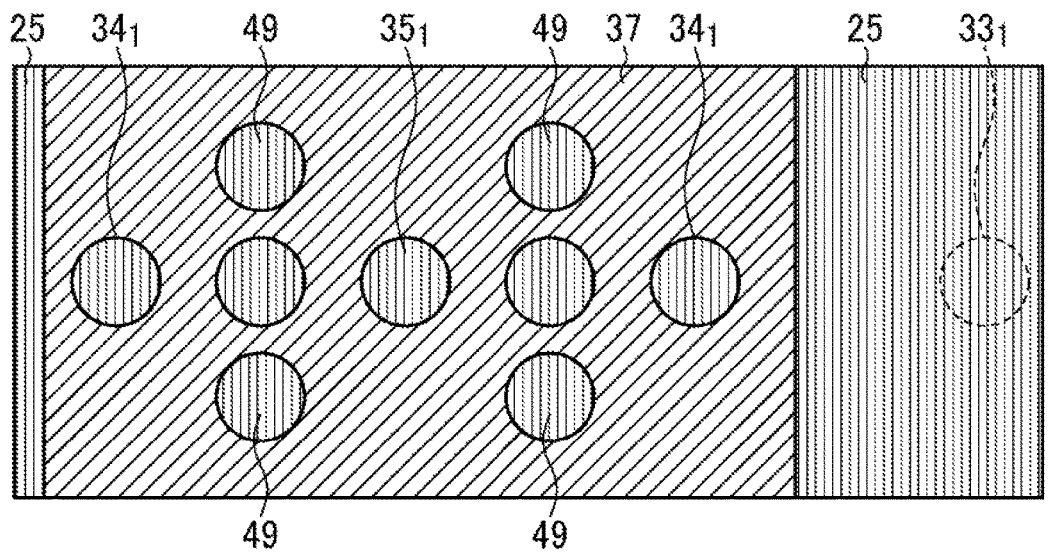
FIGS. 15A and 15B are explanatory diagrams (2) of the capacitor built-in multilayer wiring substrate according to the embodiment 4 of the present disclosure.
Figure 15B:
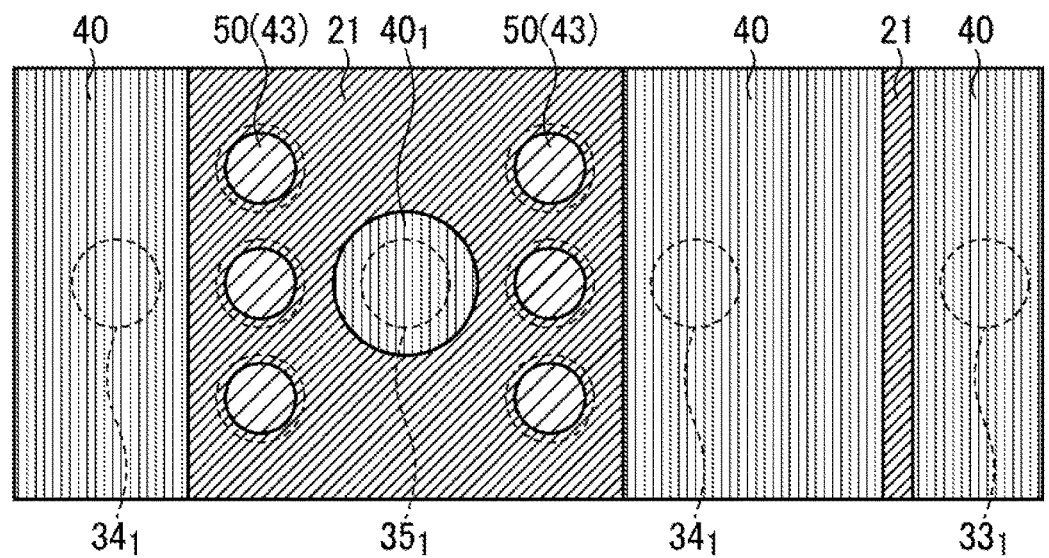

Next, a capacitor built-in multilayer wiring substrate according to the embodiment 4 of the present disclosure will be described with reference to FIGS. 14A to 15B, but since the manufacturing process is exactly the same as that of the above-described Example 1 except that the isolated conductor layer is used as a distributed isolated conductor layer, only the structure will be described. FIGS. 14A and 14B and 15A and 15B are explanatory diagrams of a capacitor built-in multilayer wiring substrate according to the embodiment 4 of the present disclosure, FIG. 14A is a cross-sectional view of a main part, FIG. 14B is a plan view at the time of forming the second conductor layer taken along a one-dot chain line connecting A-A' in FIG. 14A, FIG. 15A is a plan view of the position of the lower electrode taken along a one-dot chain line connecting B-B' in FIG. 14A, and FIG. 15B is a plan view of the position of the third conductor layer immediately after the formation of the third insulating layer taken along a one-dot chain line connecting C-C' in FIG. 14A. As illustrated in FIG. 14A, the capacitor dielectric film 21 is sandwiched between a third conductor layer 40 integrated with the upper wiring coupled to a ground line via 34 and the lower electrode 25 coupled to a power supply line via 33 to form a capacitor.

As illustrated in FIG. 14B, the second conductor layer 36 coupled to the power supply line via 33 and the ground line via 34 is a solid pattern, and a second conductor layer $36_1$ coupled to the signal line via 35 is a connection conductor pattern for coupling the vias to each other. As illustrated in FIG. 15A, the lower electrode 25 connected to a power supply line via $33_1$ is a solid pattern, and a plurality of distributed isolated conductor layers 49 are formed to surround the signal line via $35_1$ by using the copper foil (23) forming the lower electrode 25. Further, here, three distributed isolated conductor layers 49 are provided on the side of the signal line via $35_1$ toward the ground line via $34_1$, but the number may be random, and the distributed isolated conductor layers 49 may be provided to surround the upper and lower sides of the signal line via $35_1$ in the drawing.

As illustrated in FIG. 15B, the third conductor layer 40 coupled to the power supply line via $33_1$ and the ground line via $34_1$ is a solid pattern, an opening 50 is provided at a position corresponding to the distributed isolated conductor layer 49, and the capacitor dielectric film 21 is missing in the opening 50.

In the embodiment 4 of the present disclosure, a plurality of openings 50 are formed in the capacitor dielectric film 21 in the vicinity of the signal line via $35_1$, and these openings 50 are filled with an epoxy resin having a dielectric constant smaller than that of the capacitor dielectric film 21. Therefore, it is possible to reduce the parasitic capacitance of the parasitic capacitor as compared with the case where the opening 50 is not formed. In addition, in the embodiment 4 of the present disclosure, since the plurality of circular distributed isolated conductor layers 49 are formed by utilizing the copper foil 23 for forming the lower electrode 25, the surface of the base substrate 30 is not damaged by the laser irradiation when the opening 50 is formed.

Embodiment 5

Figure 16A:
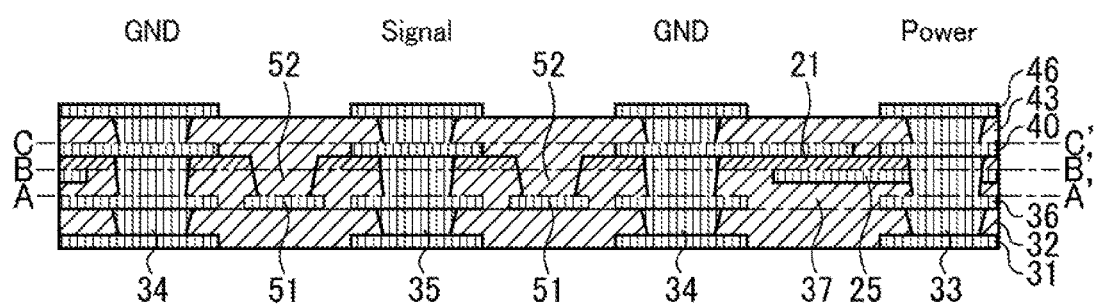
FIGS. 16A and 16B are explanatory diagrams (1) of a capacitor built-in multilayer wiring substrate according to an embodiment 5 of the present disclosure.
Figure 16B:
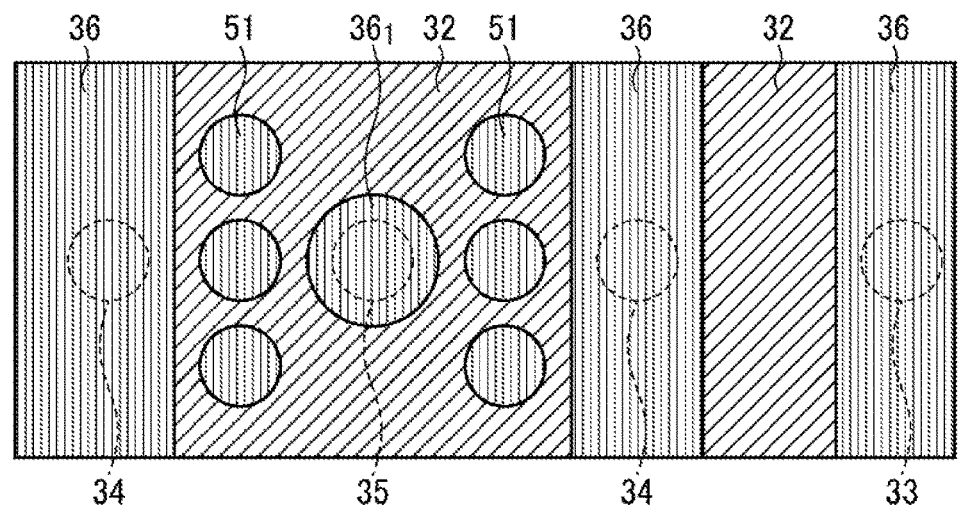
Figure 17A:
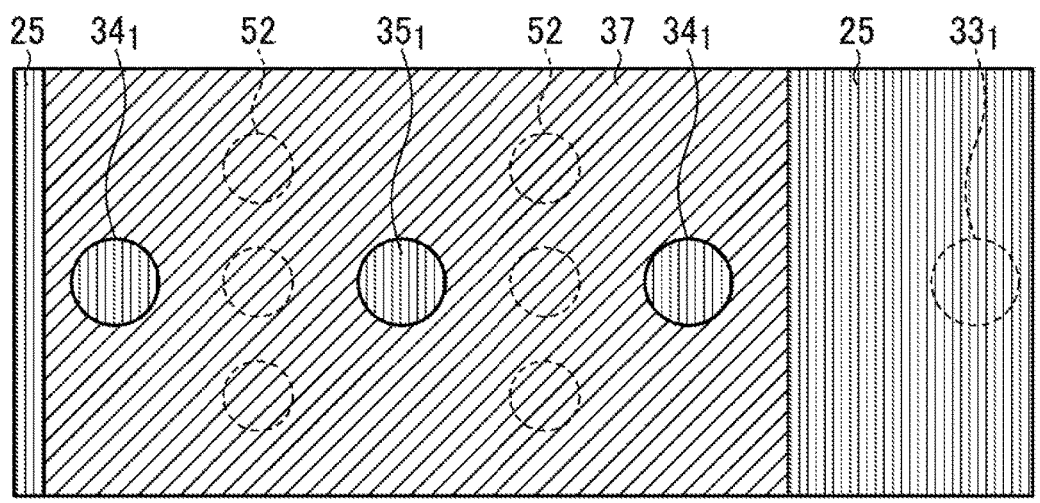
FIGS. 17A and 17B are explanatory diagrams (2) of the capacitor built-in multilayer wiring substrate according to the embodiment 5 of the present disclosure.
Figure 17B:
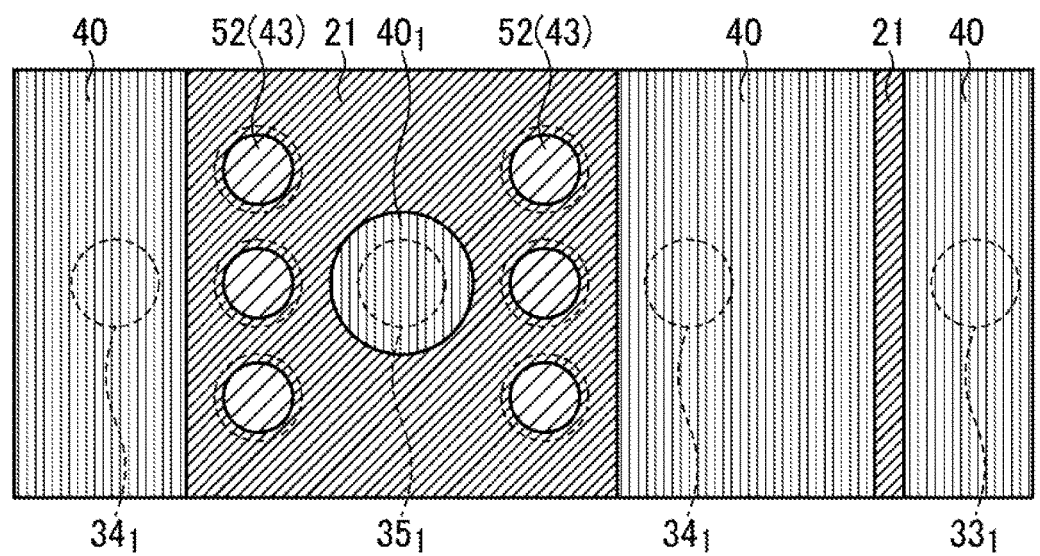

Next, a capacitor built-in multilayer wiring substrate according to the embodiment 5 of the present disclosure will be described with reference to FIGS. 16A to 17B, but since the manufacturing process is exactly the same as that of the above-described embodiment 2 except that the isolated conductor layer is used as a distributed isolated conductor layer, only the structure will be described. FIGS. 16A and 16B and 17A and 17B are explanatory diagrams of a capacitor built-in multilayer wiring substrate according to the embodiment 5 of the present disclosure, FIG. 16A is a cross-sectional view of a main part, FIG. 16B is a plan view at the time of forming the second conductor layer taken along a one-dot chain line connecting A-A' in FIG. 16A, FIG. 17A is a plan view before generating the dielectric film separating groove taken along a one-dot chain line connecting B-B' in FIG. 16A, and FIG. 17B is a plan view of the position of the third conductor layer immediately after the formation of the third insulating layer taken along a one-dot chain line connecting C-C' in FIG. 16A. As illustrated in FIG. 16A, similarly to the embodiment 5, the capacitor dielectric film 21 is sandwiched between the third conductor layer 40 integrated with the upper wiring coupled to the ground line via 34 and the lower electrode 25 coupled to the power supply line via 33 to form a capacitor.

As illustrated in FIG. 16B, the second conductor layer 36 coupled to the power supply line via 33 and the ground line via 34 is a solid pattern, and a second conductor layer 36₁ coupled to the signal line via 35 is a connection conductor pattern for coupling the vias to each other. A plurality of distributed isolated conductor layers 51 are formed to surround the signal line via 35₁ when the second conductor layers 36 and 36₁ are formed. Further, here, three distributed isolated conductor layers 51 are provided on the side of the signal line via 35₁ facing the ground line via 34₁, but the number may be random, and the distributed isolated conductor layers 51 may be provided to also surround the upper and lower sides of the signal line via 35₁ in the drawing.

As illustrated in FIG. 17A, the lower electrode 25 coupled to the power supply line via 33₁ is a solid pattern. As illustrated in FIG. 17B, the third conductor layer 40 coupled to the power supply line via 33₁ and the ground line via 34₁ is a solid pattern, an opening 52 is provided at a position corresponding to the distributed isolated conductor layer 49, and the capacitor dielectric film 21 is missing in the opening 52.

In the embodiment 5 of the present disclosure, a plurality of openings 52 are formed in the capacitor dielectric film 21 in the vicinity of the signal line via 35₁, and these openings 52 are filled with an epoxy resin having a dielectric constant smaller than that of the capacitor dielectric film 21 to form the third insulating layer 43. Therefore, it is possible to reduce the parasitic capacitance of the parasitic capacitor as compared with the case where the opening 52 is not formed. In addition, in the embodiment 5 of the present disclosure, when forming the second conductor layers 36 and 36₁, since the plurality of circular distributed isolated conductor layers 51 are formed, the surface of the base substrate 30 is not damaged by the laser irradiation when the opening 52 is formed.

Embodiment 6

Figure 18A:
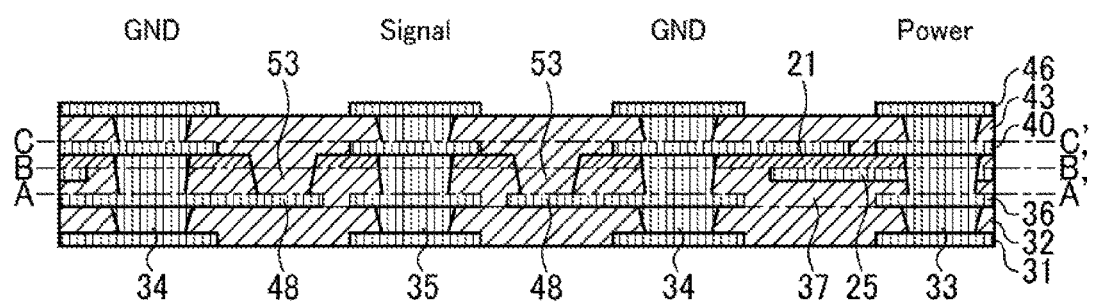
FIGS. 18A and 18B are explanatory diagrams (1) of a capacitor built-in multilayer wiring substrate according to an embodiment 6 of the present disclosure.
Figure 18B:
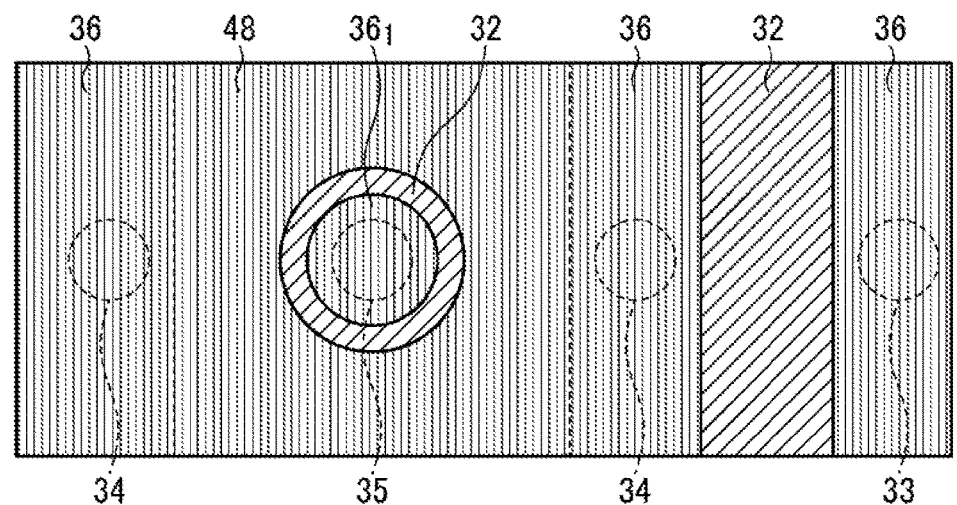
Figure 19A:
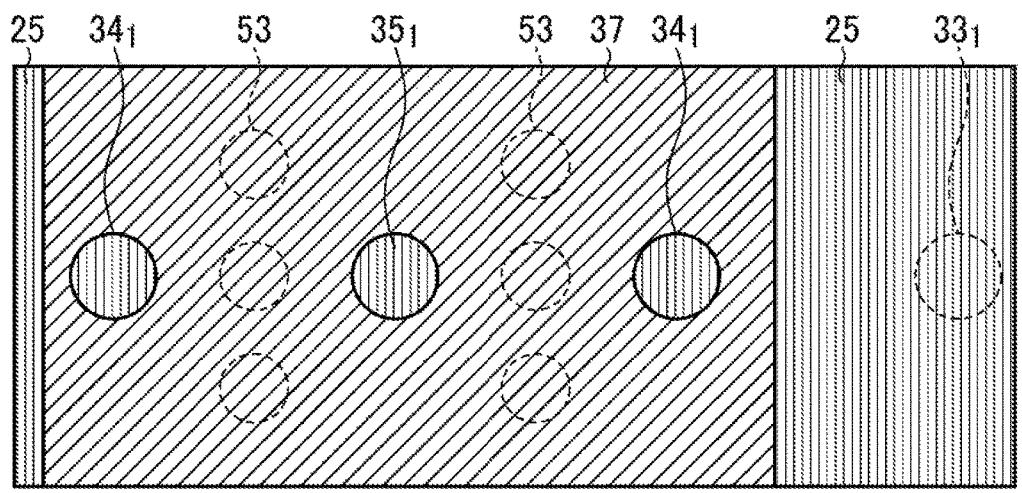
FIGS. 19A and 19B are explanatory diagrams (2) of the capacitor built-in multilayer wiring substrate according to the embodiment 6 of the present disclosure.
Figure 19B:
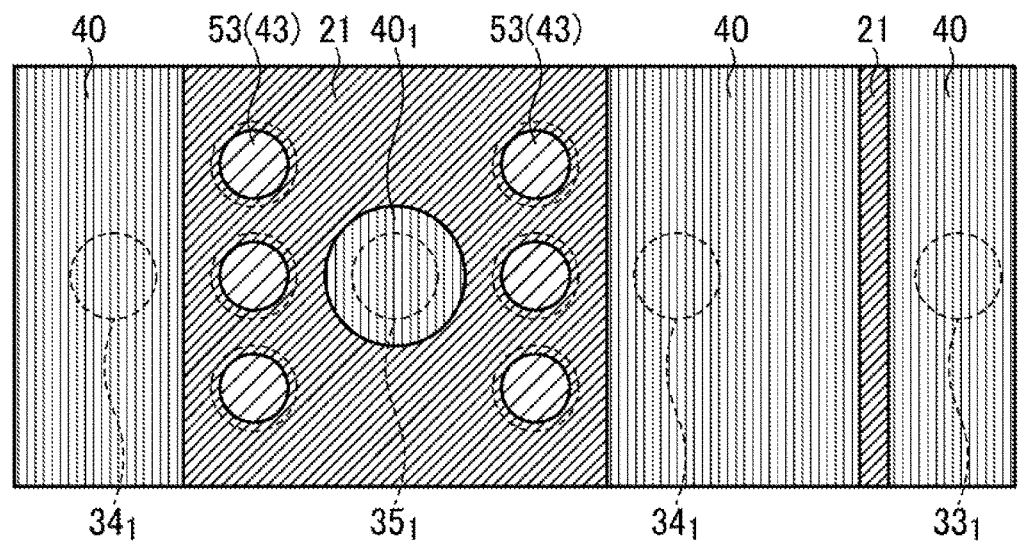

Next, a capacitor built-in multilayer wiring substrate according to the embodiment 6 of the present disclosure will be described with reference to FIGS. 18A to 19B. In the embodiment 6, since the manufacturing process is exactly the same as that of the above-described embodiment 2 except that the overhang portion 48 is provided instead of the annular isolated conductor layer 57, and a rectangular opening part is provided instead of the annular dielectric film separating groove, only the structure will be described. FIGS. 18A and 18B and 19A and 19B are explanatory diagrams of a capacitor built-in multilayer wiring substrate according to the embodiment 6 of the present disclosure, FIG. 18A is a cross-sectional view of a main part, FIG. 18B is a plan view at the time of forming the second conductor layer taken along a one-dot chain line connecting A-A' in FIG. 18A, FIG. 19A is a plan view before formation of the dielectric film separating groove taken along a one-dot chain line connecting B-B' in FIG. 18A, and FIG. 19B is a plan view of the position of the third conductor layer immediately after the formation of the third insulating layer taken along a one-dot chain line connecting C-C' in FIG. 18A. As illustrated in FIG. 18A, similarly to the embodiment 3, the capacitor dielectric film 21 is sandwiched between the third conductor layer 40 integrated with the upper wiring coupled to the ground line via 34 and the lower electrode 25 coupled to the power supply line via 33 to form a capacitor.

As illustrated in FIG. 18B, the second conductor layer 36 coupled to the power supply line via 33 and the ground line via 34 is a solid pattern, and a second conductor layer 36₁ coupled to the signal line via 35 is a connection conductor pattern for coupling the vias to each other. The overhang portion 48 of the second conductor layer 36 surrounds the signal line via 35₁.

As illustrated in FIG. 19A, the lower electrode 25 coupled to the power supply line via 33₁ is a solid pattern. As illustrated in FIG. 19B, the third conductor layer 40 coupled to the power supply line via 33₁ and the ground line via 34₁ is a solid pattern, and a plurality of openings 53 are formed at positions where the overhang portion 48 extends. Further, here, three opening parts 53 are provided on the side of the signal line via 35₁ toward the ground line via 34₁, but the number is random, and the openings 53 may be provided to surround the upper and lower sides of the signal line via 35₁ in the drawing.

In the embodiment 6 of the present disclosure, a plurality of openings 53 are formed in the capacitor dielectric film 21 in the vicinity of the signal line via 35₁, and these openings 53 are filled with an epoxy resin having a dielectric constant smaller than that of the capacitor dielectric film 21 to form the fourth insulating layer 43. Therefore, it is possible to reduce the parasitic capacitance of the parasitic capacitor as compared with the case where the opening 53 is not formed. In addition, in the embodiment 6 of the present disclosure, since the overhang portion 48 of the second conductor layer 36 is formed toward the signal line via 35, the surface of the base substrate 30 is not damaged by the laser irradiation when the opening 53 is formed.

Embodiment 7

Figure 20A:
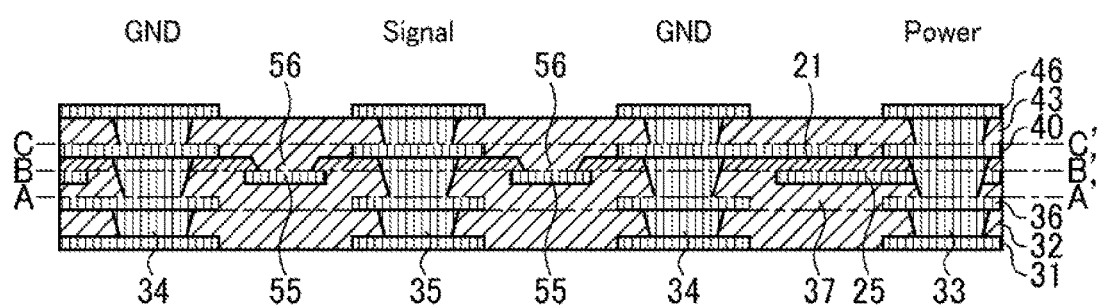
FIGS. 20A and 20B are explanatory diagrams (1) of a capacitor built-in multilayer wiring substrate according to an embodiment 7 of the present disclosure.
Figure 20B:
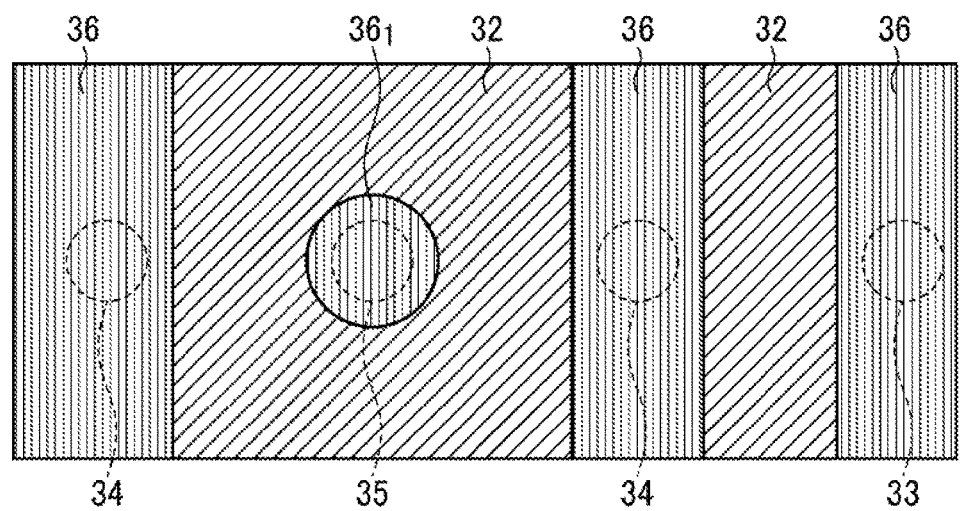
Figure 21A:
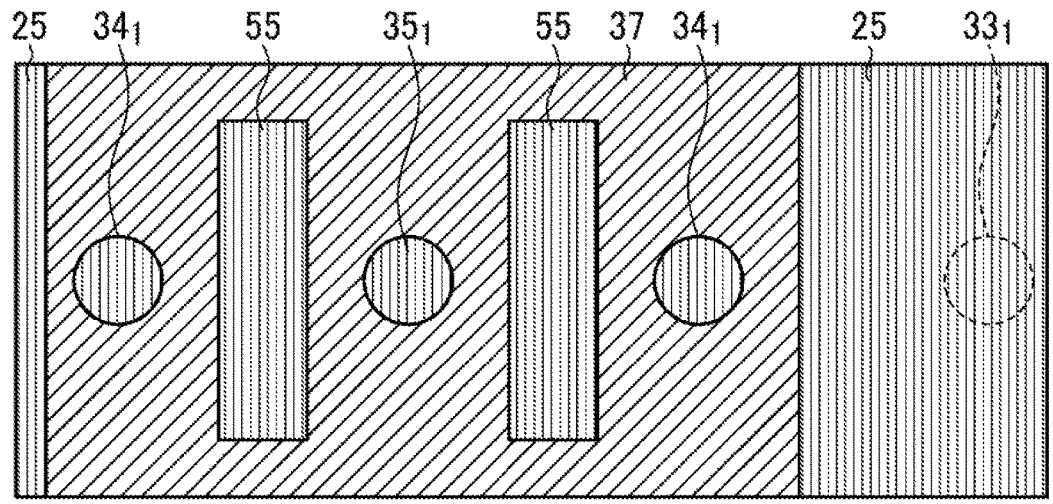
FIGS. 21A and 21B are explanatory diagrams (2) of the capacitor built-in multilayer wiring substrate according to the embodiment 7 of the present disclosure.
Figure 21B:
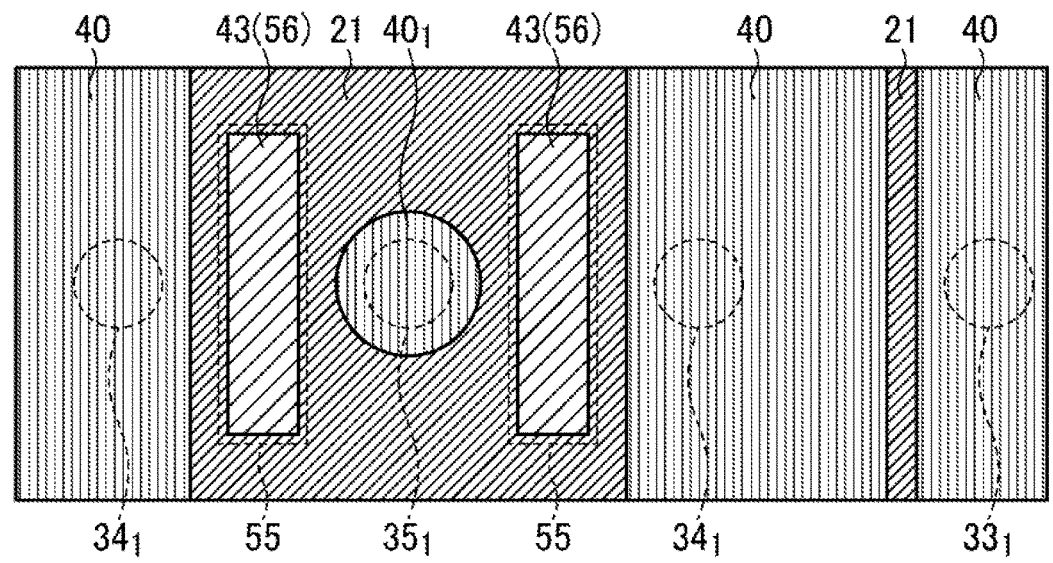

Next, a capacitor built-in multilayer wiring substrate according to the embodiment 7 of the present disclosure will be described with reference to FIGS. 20A to 21C, but since the manufacturing process is exactly the same as that of the above-described the embodiment 1 except that the annular isolated conductor layer is a rectangular isolated conductor layer, only the structure will be described. FIGS. 20A and 20B and 21A and 21B are explanatory diagrams of a capacitor built-in multilayer wiring substrate according to the embodiment 7 of the present disclosure, FIG. 20A is a cross-sectional view of a main part, FIG. 20B is a plan view at the time of forming the second conductor layer taken along a one-dot chain line connecting A-A' in FIG. 20A, FIG. 21A is a plan view of the position of the lower electrode taken along a one-dot chain line connecting B-B' in FIG. 20A, and FIG. 21B is a plan view of the position of the third conductor layer immediately after the formation of the third insulating layer taken along a one-dot chain line connecting C-C' in FIG. 20A. As illustrated in FIG. 21A, the capacitor dielectric film 21 is sandwiched between a third conductor layer 40 integrated with the upper wiring coupled to a ground line via 34 and the lower electrode 25 coupled to a power supply line via 33 to form a capacitor.

As illustrated in FIG. 20B, the second conductor layer 36 coupled to the power supply line via 33 and the ground line via 34 is a solid pattern, and a second conductor layer 36₁ coupled to the signal line via 35 is a connection conductor pattern for coupling the vias to each other. As illustrated in FIG. 21A, the lower electrode 25 coupled to a power supply line via 33₁ is a solid pattern, and a rectangular isolated conductor layer 55 is formed on both sides of the signal line via 35₁ by using the copper foil (23) forming the lower electrode 25. Further, here, a pair of isolated conductor layers 55 are provided on the side of the signal line via 35₁ facing the ground line via $34_1$, but the isolated conductor layers 55 may be provided above and below the signal line via $35_1$ in the drawing.

As illustrated in FIG. 21B, the third conductor layer 40 coupled to the power supply line via $33_1$ and the ground line via $34_1$ is a solid pattern, an opening 56 is provided at a position corresponding to the isolated conductor layer 55, and the capacitor dielectric film 21 is missing in the opening part 56.

In the embodiment 7 of the present disclosure, a pair of openings 56 corresponding to the isolated conductor layer 55 are formed in the capacitor dielectric film 21 in the vicinity of the signal line via $35_1$, and these openings 56 are filled with an epoxy resin having a dielectric constant smaller than that of the capacitor dielectric film 21 to form the fourth insulating layer 43. Therefore, it is possible to reduce the parasitic capacitance of the parasitic capacitor as compared with the case where the opening 56 is not formed. In addition, in the embodiment 7 of the present disclosure, since a pair of isolated conductor layers 55 are formed by utilizing the copper foil 23 for forming the lower electrode 25, the surface of the base substrate 30 is not damaged by the laser irradiation when the opening 56 is formed.

Embodiment 8

Figure 22A:
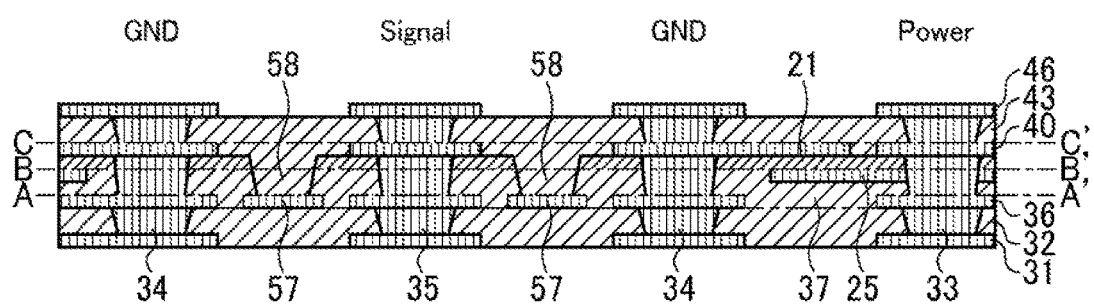
FIGS. 22A and 22B are explanatory diagrams (1) of a capacitor built-in multilayer wiring substrate according to an embodiment 8 of the present disclosure.
Figure 22B:
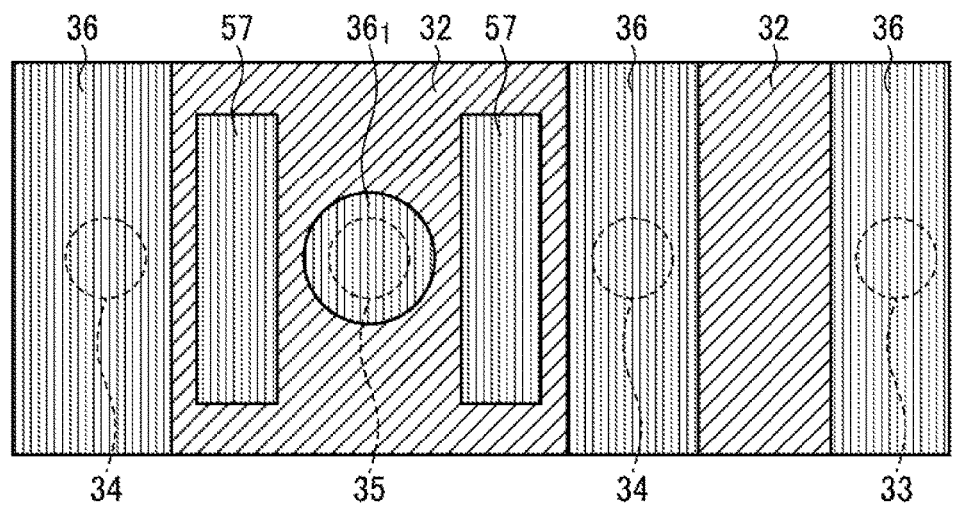
Figure 23A:
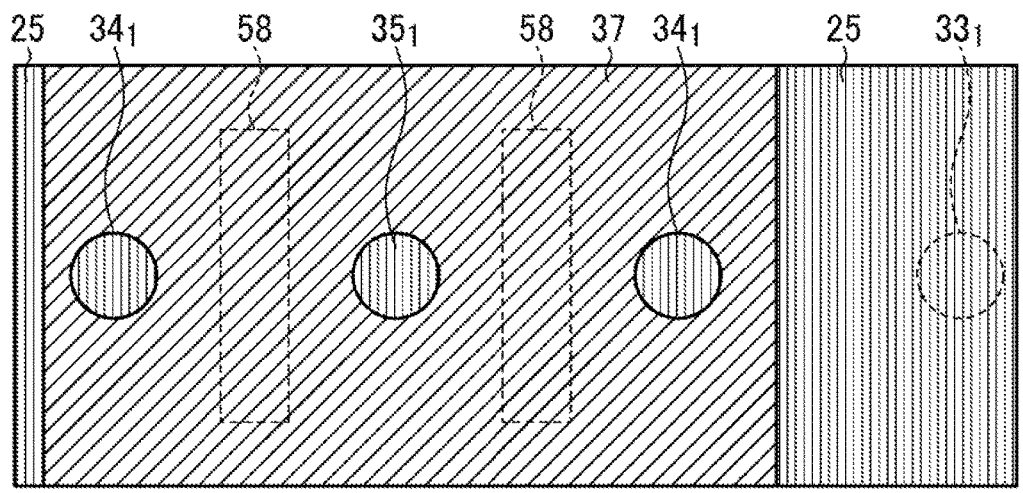
FIGS. 23A and 23B are explanatory diagrams (2) of the capacitor built-in multilayer wiring substrate according to the embodiment 8 of the present disclosure.
Figure 23B:
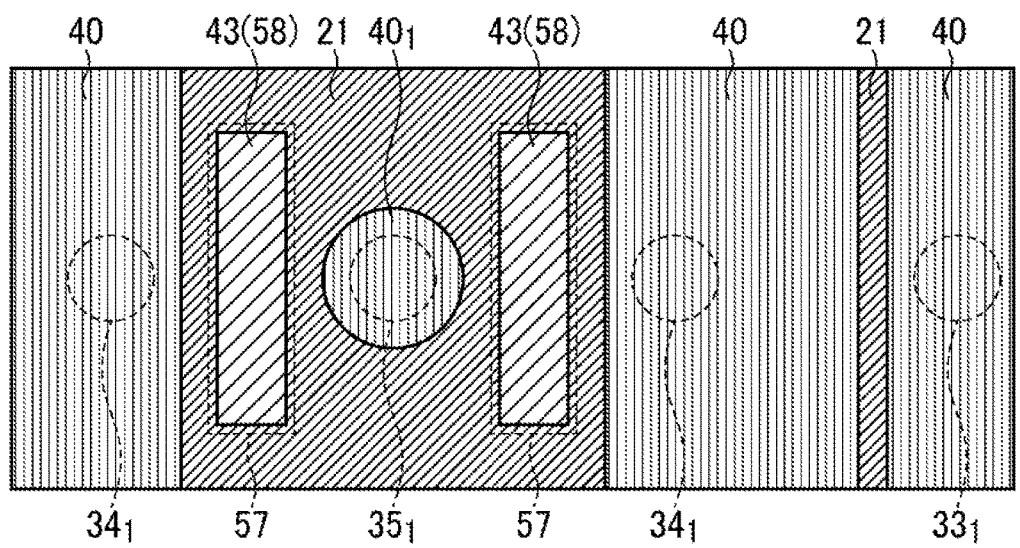

Next, a capacitor built-in multilayer wiring substrate according to the embodiment 8 of the present disclosure will be described with reference to FIGS. 22A to 23B, but since the manufacturing process is exactly the same as that of the above-described the embodiment 2 except that the annular isolated conductor layer is a rectangular isolated conductor layer, only the structure will be described. FIGS. 22A and 22B and 23A and 23B are explanatory diagrams of a capacitor built-in multilayer wiring substrate according to the embodiment 8 of the present disclosure, FIG. 22A is a cross-sectional view of a main part, FIG. 22B is a plan view at the time of forming the second conductor layer taken along a one-dot chain line connecting A-A' in FIG. 22A, FIG. 23A is a plan view before formation of the dielectric film separating groove taken along a one-dot chain line connecting B-B' in FIG. 22A, and FIG. 23B is a plan view of the position of the third conductor layer immediately after the formation of the third insulating layer taken along a one-dot chain line connecting C-C' in FIG. 22A. As illustrated in FIG. 22A, similarly to the embodiment 8, the capacitor dielectric film 21 is sandwiched between the third conductor layer 40 integrated with the upper wiring coupled to the ground line via 34 and the lower electrode 25 coupled to the power supply line via 33 to form a capacitor.

As illustrated in FIG. 22B, the second conductor layer 36 coupled to the power supply line via 33 and the ground line via 34 is a solid pattern, and a second conductor layer $36_1$ coupled to the signal line via 35 is a connection conductor pattern for coupling the vias to each other. When forming the second conductor layers 36 and $36_1$, a rectangular isolated conductor layer 57 is formed on both sides of the signal line via $35_1$. Further, here, a pair of isolated conductor layers 57 are provided on the side of the signal line via $35_1$ facing the ground line via $34_1$, but the isolated conductor layers 57 may be provided above and below the signal line via $35_1$ in the drawing.

As illustrated in FIG. 23A, the lower electrode 25 coupled to the power supply line via $33_1$ is a solid pattern. As illustrated in FIG. 23B, the third conductor layer 40 coupled to the power supply line via $33_1$ and the ground line via $34_1$ is a solid pattern, an opening 58 is provided at a position corresponding to a pair of isolated conductor layers 57, and the capacitor dielectric film 21 is missing in the opening 58.

In the embodiment 8 of the present disclosure, a pair of openings 58 are formed in the capacitor dielectric film 21 in the vicinity of the signal line via $35_1$, and these openings 58 are filled with an epoxy resin having a dielectric constant smaller than that of the capacitor dielectric film 21 to form the fourth insulating layer 43. Therefore, it is possible to reduce the parasitic capacitance of the parasitic capacitor as compared with the case where the opening 58 is not formed. In addition, in the embodiment 8 of the present disclosure, when forming the second conductor layers 36 and $36_1$, since a pair of isolated conductor layers 57 are formed, the surface of the base substrate 30 is not damaged by the laser irradiation when the opening 58 is formed.

Embodiment 9

Figure 24A:
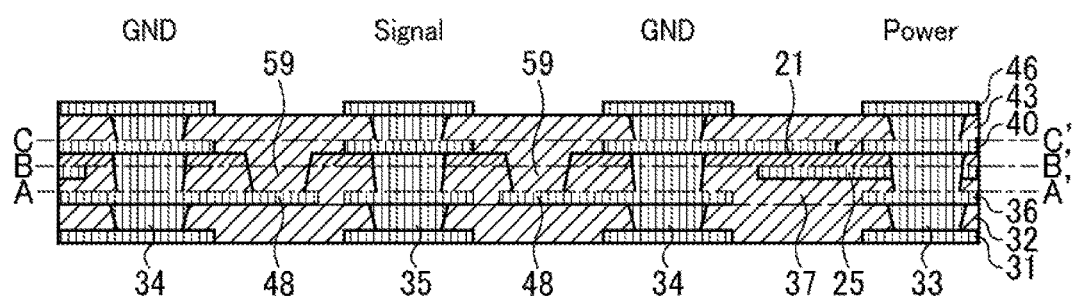
FIGS. 24A and 24B are explanatory diagrams (1) of a capacitor built-in multilayer wiring substrate according to an embodiment 9 of the present disclosure.
Figure 24B:
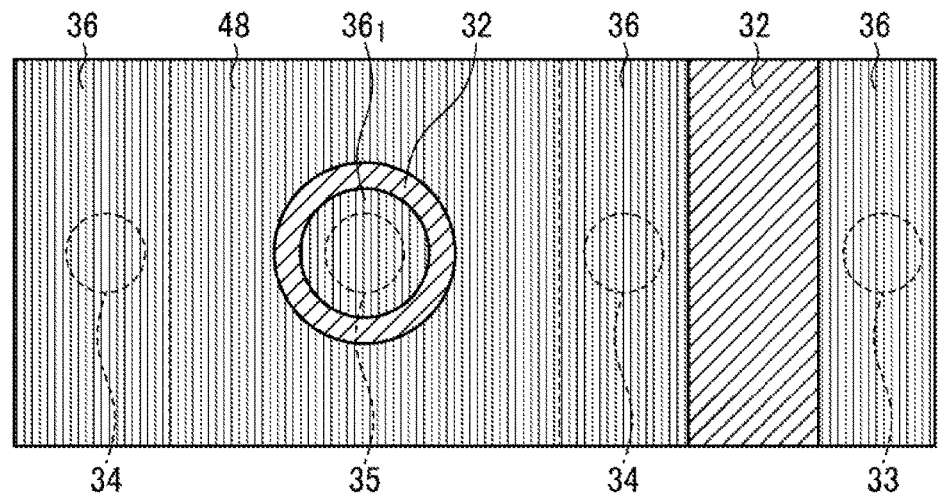
Figure 25A:
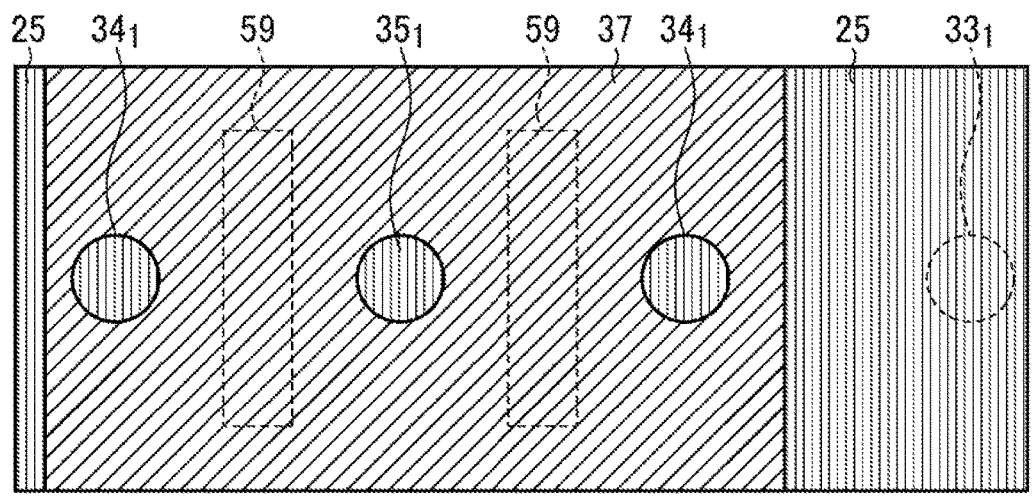
FIGS. 25A and 25B are explanatory diagrams (2) of the capacitor built-in multilayer wiring substrate according to the embodiment 9 of the present disclosure.
Figure 25B:
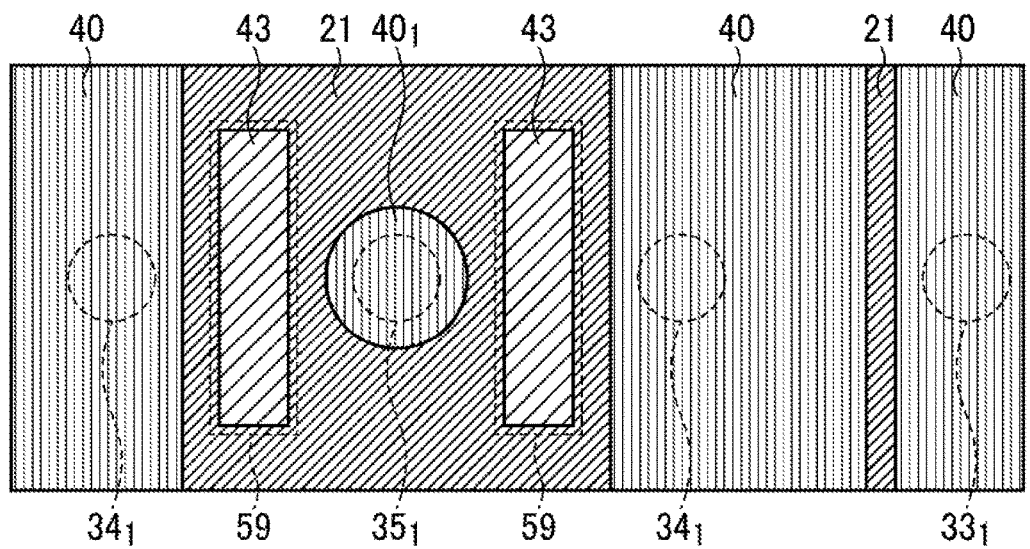

Next, a capacitor built-in multilayer wiring substrate according to the embodiment 9 of the present disclosure will be described with reference to FIGS. 24A to 25B. In Example 9, since the manufacturing process is exactly the same as that of the above-described embodiment 2 except that the overhang portion 48 is provided instead of the annular isolated conductor layer 57, and a rectangular opening is provided instead of the annular dielectric film separating groove, only the structure will be described. FIGS. 24A and 24B and 25A and 25B are explanatory diagrams of a capacitor built-in multilayer wiring substrate according to the embodiment 9 of the present disclosure, FIG. 24A is a cross-sectional view of a main part, FIG. 24B is a plan view at the time of forming the second conductor layer taken along a one-dot chain line connecting A-A' in FIG. 24A, FIG. 25A is a plan view before formation of the dielectric film separating groove taken along a one-dot chain line connecting B-B' in FIG. 24A, and FIG. 25B is a plan view of the position of the third conductor layer immediately after the formation of the third insulating layer taken along a one-dot chain line connecting C-C' in FIG. 24A. As illustrated in FIG. 24A, similarly to the embodiment 3, the capacitor dielectric film 21 is sandwiched between the third conductor layer 40 integrated with the upper wiring coupled to the ground line via 34 and the lower electrode 25 coupled to the power supply line via 33 to form a capacitor.

As illustrated in FIG. 24B, the second conductor layer 36 coupled to the power supply line via 33 and the ground line via 34 is a solid pattern, and a second conductor layer $36_1$ coupled to the signal line via 35 is a connection conductor pattern for coupling the vias to each other. The overhang portion 48 of the second conductor layer 36 surrounds the signal line via $35_1$.

As illustrated in FIG. 25A, the lower electrode 25 connected to the power supply line via $33_1$ is a solid pattern. As illustrated in FIG. 25B, the third conductor layer 40 connected to the power supply line via $33_1$ and the ground line via $34_1$ is a solid pattern, and a pair of rectangular openings 59 are formed at positions where the overhang portion 48 extends. Further, here, a pair of openings 59 are provided on the side of the signal line via $35_1$ facing the ground line via $34_1$, but the openings 59 may be provided above and below the signal line via $35_1$ in the drawing.

In the embodiment 9 of the present disclosure, a plurality of openings 59 are formed in the capacitor dielectric film 21 in the vicinity of the signal line via $35_1$, and these openings 59 are filled with an epoxy resin having a dielectric constant smaller than that of the capacitor dielectric film 21 to form the fourth insulating layer 43. Therefore, it is possible to reduce the parasitic capacitance of the parasitic capacitor as compared with the case where the opening 59 is not formed. In addition, in the embodiment 9 of the present disclosure, since the overhang portion 48 of the second conductor layer 36 is formed toward the signal line via 35, the surface of the base substrate 30 is not damaged by the laser irradiation when the opening 59 is formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A capacitor built-in multilayer wiring substrate comprising:
   a signal line laminated via, a ground line laminated via, and a power supply line laminated via;
   a first group of first conductor layers formed at a first wiring layer level and individually and electrically coupled to the signal line laminated via, the ground line laminated via, and the power supply line laminated via;
   a second conductor layer formed at a second wiring layer level and individually and electrically coupled to at least the power supply line laminated via;
   a second group of third conductor layers formed at a third wiring layer level and individually and electrically coupled to the signal line laminated via, the ground line laminated via, and the power supply line laminated via;
   a first insulating layer formed between the first wiring layer level and the second wiring layer level; and
   a second insulating layer formed between the second wiring layer level and the third wiring layer level, wherein
   the second insulating layer has a through opening filled with a third insulating layer in a vicinity of the signal line laminated via,
   a relative dielectric constant of the second insulating layer is higher than relative dielectric constants of the first insulating layer and the third insulating layer, and
   the through opening reaches a conductor pattern.

2. The capacitor built-in multilayer wiring substrate according to claim 1, wherein
   the conductor pattern is a conductor pattern formed at the second wiring layer level and electrically insulated from other portions.

3. The capacitor built-in multilayer wiring substrate according to claim 1, wherein
   the conductor pattern is a conductor pattern formed at the first wiring layer level and electrically insulated from other portions.

4. The capacitor built-in multilayer wiring substrate according to claim 1, wherein
   the conductor pattern is an overhang portion of one of the first conductor layers formed at the first wiring layer level and electrically connected to the ground line laminated via formed at the first wiring layer level.

5. The capacitor built-in multilayer wiring substrate according to claim 1, wherein
   the through opening is a frame-shaped through opening surrounding the signal line laminated via.

6. The capacitor built-in multilayer wiring substrate according to claim 5, wherein
   the frame-shaped through opening is an annular through opening.

7. The capacitor built-in multilayer wiring substrate according to claim 1, wherein
   the conductor pattern is a conductor pattern having a plurality of dot shapes and provided between at least the signal line laminated via and the ground line laminated via, and
   the through opening is a plurality of dotted through openings provided between at least the signal line laminated via and the ground line laminated via.

8. The capacitor built-in multilayer wiring substrate according to claim 1, wherein
   the conductor pattern is a rectangular conductor pattern having a longer side length larger than a diameter of the signal line laminated via and provided between at least the signal line laminated via and the ground line laminated via, and
   the through opening is a rectangular through opening having a longer side length larger than the diameter of the signal line laminated via and provided between at least the signal line laminated via and the ground line laminated via.

9. The capacitor built-in multilayer wiring substrate according to claim 4, wherein
   the through opening is a plurality of dotted through openings provided between at least the signal line laminated via and the ground line laminated via.

10. The capacitor built-in multilayer wiring substrate according to claim 4, wherein
    the through opening is a rectangular through opening having a longer side length larger than a diameter of the signal line laminated via and provided between at least the signal line laminated via and the ground line laminated via.

* * * * *